(12) United States Patent
Sederberg et al.

(10) Patent No.: US 10,810,795 B2
(45) Date of Patent: Oct. 20, 2020

(54) ISOGEOMETRIC ANALYSIS AND COMPUTER-AIDED DESIGN USING S-SPLINES

(71) Applicant: S-Splines, LLC, Orem, UT (US)

(72) Inventors: Thomas W. Sederberg, Orem, UT (US); Xin Li, Hefei (CN)

(73) Assignee: S-SPLINES, LLC, Orem, UT (US)

( * ) Notice: Subject to any disclaimer, the term of this patent is extended or adjusted under 35 U.S.C. 154(b) by 0 days.

(21) Appl. No.: 16/439,343

(22) Filed: Jun. 12, 2019

(65) Prior Publication Data
US 2019/0385366 A1 Dec. 19, 2019

Related U.S. Application Data

(60) Provisional application No. 62/684,620, filed on Jun. 13, 2018.

(51) Int. Cl.
*G06T 17/30* (2006.01)
*G06T 17/20* (2006.01)
*G06F 30/00* (2020.01)

(52) U.S. Cl.
CPC .............. *G06T 17/30* (2013.01); *G06T 17/20* (2013.01); *G06F 30/00* (2020.01)

(58) Field of Classification Search
None
See application file for complete search history.

(56) References Cited

U.S. PATENT DOCUMENTS

| 5,488,684 | A * | 1/1996 | Gharachorloo | G06T 15/50 |
| | | | | 345/423 |
| 9,269,189 | B1 * | 2/2016 | Marinov | G06T 17/30 |
| 2015/0106065 | A1 * | 4/2015 | Hartmann | G06F 30/23 |
| | | | | 703/2 |

(Continued)

OTHER PUBLICATIONS

Bazilevs, et al., "Isogeometric analysis using T-splines", Computer Methods in Applied Mechanics and Engineering, vol. 199, No. 5-8, 2010, pp. 229-263.

(Continued)

*Primary Examiner* — Edward Martello
(74) *Attorney, Agent, or Firm* — Brake Hughes Bellermann LLP

(57) ABSTRACT

Techniques of refining a model of a complex surface can include refining, upon insertion of a new control point, only those blending functions corresponding to the control points adjacent to the control point being inserted. The resulting curves cannot be considered as B-splines because the relationship between blending functions corresponding to adjacent control points no longer has a fixed relationship. Rather, the resulting blending functions, denoted herein as "S-splines," sacrifice this fixed relationship in exchange for the ability to specify how many blending functions corresponding to adjacent control points are refined when performing exact local refinement. S-splines do not produce excess control points and have a simple representation. While the resulting functions representing the surface are not B-splines, they allow for exact refinement without affecting the blending functions corresponding to control points not neighboring the new control point. Such a representation uses fewer computing resources and improves the user experience.

20 Claims, 34 Drawing Sheets

(56) References Cited

U.S. PATENT DOCUMENTS

| | | | |
|---|---|---|---|
| 2016/0275207 A1* | 9/2016 | Qian | G06F 30/23 |
| 2018/0365371 A1* | 12/2018 | Urick | G06F 30/20 |

OTHER PUBLICATIONS

Benson, et al., "A generalized finite element formulation for arbitrary basis functions: from isogeometric analysis to XFEM", International Journal for Methods in Engineering, vol. 83, Aug. 2010, 22 pages.

Borden, et al., "A phase-field description of dynamic brittle fracture", Computer Methods in Applied Mechanics and Engineering, vol. 217-220, 2012, pp. 77-95.

Buffa, et al., "Characterization of T-splines with reduced continuity order on T-meshes", Computer Methods in Applied Mechanics and Engineering, vol. 201-204, 2012, pp. 112-126.

Deng, et al., "Dimensions of spline spaces over T-meshes", Journal of Computational and Applied Mathematics, vol. 194, No. 2, 2006, pp. 267-283.

Deng, et al., "Polynomial splines over hierarchical T-meshes", Graphical Models, vol. 70, 4, 2008, pp. 76-86.

Dimitri, et al., "Isogeometric large deformation frictionless contact using T-splines", Computer Methods in Applied Mechanics and Engineering, vol. 269, 2014, pp. 394-414.

Dokken, et al., "Polynomial splines over locally refined box-partitions", Computer Aided Geometric Design, vol. 30 , No. 3, 2013, pp. 331-356.

Dörfel, et al., "Adaptive isogeometric analysis by local h-refinement with T-splines", Computer Methods Applications Mechanical Engineering, vol. 199, No. 5-8, 2010, pp. 264-275.

Evans, et al., "Hierarchical T-splines: Analysis-suitability, Bezier extraction, and application as an adaptive basis for isogeometric analysis", Computer Methods in Applied Mechanics and Engineering, vol. 284, 2015, pp. 1-20.

Forsey, et al., "Hierarchical B-spline refinement", Computer Graphics, vol. 22, No. 4, 1988, pp. 205-212.

Grinspun, et al., "CHARMS: a simple framework for adaptive simulation", ACM Transactions on Graphics (TOG), vol. 21, No. 3, 2002, pp. 281-290.

Johannessen, et al., "Isogeometric analysis using LR B-splines", Computer Methods in Applied Mechanics and Engineering, vol. 269, 2014, pp. 471-514.

Kang, et al., "Modified T-splines", Computer Aided Geometric Design, vol. 30 , No. 9, 2013, pp. 827-843.

Krysl, et al., "Natural hierarchical refinement for finite element methods", International Journal for Numerical Methods in Engineering, vol. 56, No. 8, 2003, pp. 1109-1124.

Li, et al., "Analysis-suitable T-splines: characterization, refinablility and approximation", arXiv:1211.5669v1, Nov. 24, 2012, 27 pages.

Li, et al., "AS++ T-splines: Linear Independence and approximation", Computer Methods in Applied Mechanics and Engineering, vol. 333, 2018, pp. 462-474.

Li, et al., "On the dimension of splines spaces over T-meshes with smoothing cofactor-conformality method", Computer Aided Geometric Design, vol. 41, 2016, pp. 76-86.

Li, et al., "On the linear independence of T-splines blending functions", Computer Aided Geometric Design, vol. 29, No. 1, 2012, pp. 63-76.

Li, et al., "Polynomial splines over general T-meshes", The Visual Computer, vol. 26, No. 4, Dec. 8, 2009, 11 pages.

Li, et al., "Surface modeling with polynomial splines over hierarchical T-meshes", The Visual Computer, vol. 23, 2007, pp. 1027-1033.

Liu, et al., "Volumetric T-spline construction using boolean operations", ICES Report 13-19, The Institute for Computation Engineering and Sciences, The University of Texas at Austin, Jul. 2013, 20 pages.

Liu, et al., "Weighted T-splines with application in reparameterizing trimmed NURBS surfaces", Computer Methods in Applied Mechanics and Engineering, vol. 295, 2015, pp. 108-126.

Nguyen-Thanh, et al., "Isogeometric analysis using polynomial splines over hierarchical T-meshes for two-dimensional elastic solids", Computer Methods in Applied Mechanics and Engineering, vol. 200, 2011, pp. 1892-1908.

Peerlings, et al., "Gradient enhanced damage for quasi-brittle materials", International Journal Number Methods Engineering, vol. 39, 1996, pp. 3391-3403.

Schillinger, et al., "An isogeometric design-through-analysis methodology based on adaptive hierarchical refinement of NURBS, immersed boundary methods, and T-spline CAD surfaces", Computer Methods in Applied Mechanics and Engineering, vol. 249-252, 2012, pp. 116-150.

Scott, et al., "Isogeometric boundary element analysis using unstructured T-splines", Computer Methods in Applied Mechanics and Engineering, vol. 254, 2013, pp. 197-221.

Scott, et al., "Isogeometric finite element data structures based on Bézier extraction of T-splines", International journal for Numerical Methods in Engineering, 2010, pp. 1-40.

Scott, et al., "Local refinement of analysis-suitable T-splines", Computer Methods in Applied Mechanics and Engineering, vol. 213-216, 2012, pp. 206-222.

Sederberg, et al., "T-spline simplification and local refinement", ACM Trans. Graph, vol. 23, No. 3, 2004, pp. 276-283.

Sederberg, et al., "T-splines and T-NURCCSs", ACM Transactions on Graphics (TOG), vol. 22, No. 3, 2003, pp. 477-484.

Veiga, et al., "Analysis-suitable T-splines are dual-compatible", Computer Methods in Applied Mechanics and Engineering, vol. 249-252, 2012, pp. 42-51.

Veiga, et al., "Analysis-suitable T-splines of arbitrary degree: definition and properties", Mathematical Models and Methods in Applied Sciences, vol. 23, 2013, pp. 1979-2003.

Veiga, et al., "Isogeometric analysis using T-splines on two-patch geometries", Computer Methods in Applied Mechanics and Engineering, vol. 200, No. 21-22, 2011, pp. 1787-1803.

Verhoosel, et al., "An isogeometric analysis approach to gradient damage models", International Journal For Number Methods in Engineering, 2010, pp. 1-22.

Verhoosel, et al., "An isogeometric approach to cohesive zone modeling", International Journal for Numerical Methods in Engineering, 2000, pp. 1-30.

Vuong, et al., "A hierarchical approach to adaptive local refinement in isogeometric analysis", Computer Methods in Applied Mechanics and Engineering, vol. 200, No. 49-52, 2011, pp. 3554-3567.

Wang, et al., "Adaptive isogeometric analysis using rational PHT-splines", Computer-Aided Design, vol. 43, 2011, pp. 1438-1448.

Wei, et al., "Truncated T-splines: Fundamentals and methods", Computer Methods in Applied Mechanics and Engineering, vol. 316, 2016, pp. 349-372.

Zeng, et al., "Dimensions of biquadratic and bicubic spline spaces over hierarchical T-meshes", Journal of Computational and Applied Mathematics, vol. 287, 2015, pp. 162-178.

Zhang, et al., "Local refinement of analysis-suitable++ T-splines", Computer Methods in Applied Mechanics and Engineering, vol. 342, 2018, pp. 32-45.

* cited by examiner

US 10,810,795 B2

ISOGEOMETRIC ANALYSIS AND COMPUTER-AIDED DESIGN USING S-SPLINES

CROSS-REFERENCE TO RELATED APPLICATIONS

This application is a nonprovisional of, and claims priority to, U.S. Provisional Patent Application No. 62/684,620, filed on Jun. 13, 2018, entitled "ISOGEOMETRIC ANALYSIS AND COMPUTER-AIDED DESIGN USING S-SPLINES," the disclosure of which are incorporated by reference herein in their entireties.

TECHNICAL FIELD

This description relates to generation of surface models of physical objects for manufacture.

BACKGROUND

Some precision manufacturing technologies use mathematical models of complex surfaces to represent manufacturable objects. Such models include non-uniform rational B-spline (NURBS) surfaces and are defined by a grid of control points on a control polyhedron that forms a convex hull of the surface. Exact refinement of a model includes insertion of new control points into the grid without changing the surface. Exact refinement is desired when more precise manipulation of the surface is needed. Nevertheless, for exact refinement, a surface modeled with conventional B-splines must insert entire rows of control points even when only a few new control points are desired.

T-splines were developed to address the issue of local control in which partial rather than entire rows of control points are allowed for exact refinement. A T-spline representation of a surface imposes structure on the control points defining the surface by defining rules for the knot intervals defining the T-spline blending functions. These rules determine how new control points are inserted into a T-mesh for exact refinement. Nevertheless, T-splines may still produce unwanted control points due to the imposition of the rules.

SUMMARY

In one general aspect, a method can include receiving, by processing circuitry configured to generate a surface model representing an object, spatial mesh data representing a first spatial mesh, the first spatial mesh including a first plurality of control points, each of the first plurality of control points having a respective spatial position and corresponding to a respective B-spline blending function of a first plurality of B-spline blending functions, each of the plurality of first B-spline blending functions being defined by a respective local knot array and representing the surface model. The method can also include performing, by the processing circuitry, a control point insertion operation on the spatial mesh data to add an additional control point to the first spatial mesh and produce a second spatial mesh, the second spatial mesh including a second plurality of control points, the second plurality of control points including the first plurality of control points and the additional control point, each of the second plurality of control points having a respective spatial position and corresponding to a respective B-spline blending function of a second plurality of B-spline blending functions, the respective B-spline blending functions of the second plurality of B-spline blending functions to which a specified number of control points of the second plurality of control points adjacent to the additional control point correspond being defined by a respective local knot array different from the respective local knot array of a B-spline blending function of the first plurality of B-spline blending functions having the same spatial position, the respective B-spline blending functions of the second plurality of B-spline blending functions to which the other control points of the second plurality of control points correspond being defined by a respective local knot array that is the same as the respective local knot array of a B-spline blending function of the first plurality of B-spline blending functions having the same spatial position.

The details of one or more implementations are set forth in the accompa-nying drawings and the description below. Other features will be apparent from the description and drawings, and from the claims.

DETAILED DESCRIPTION

The above-described conventional approaches to representing surfaces such as B-splines and T-splines produce many unwanted control points. Such unwanted control points may require excess computing resources and could degrade the user experience. In addition, T-splines tend to introduce too much complexity into the surface representation.

In accordance with the implementations described herein and in contrast to at least some of the conventional approaches to refining a model of a complex surface, improved techniques of refining a model of a complex surface can include refining, upon insertion of a new control point, only those blending functions corresponding to the control points adjacent to the control point being inserted.

The resulting curves cannot be considered as B-splines because the relationship between blending functions corresponding to adjacent control points no longer has a fixed relationship. Rather, the resulting blending functions, denoted herein as "S-splines," sacrifice this fixed relationship in exchange for the ability to specify how many blending functions corresponding to adjacent control points are refined when performing exact local refinement.

Advantageously, S-splines do not produce any excess control points and have a simple representation. While the resulting functions representing the surface are not B-splines, they allow for exact refinement without affecting the blending functions corresponding to control points not neighboring the new control point. Such a representation uses fewer computing resources and improves the user experience. Moreover, a refinement algorithm for S-splines, described herein, preserves linear independence of the blending functions. Hence, S-spline surfaces provide minimal degrees of freedoms during adaptive local refinement.

It is noted that, while the discussion herein focuses on cubic basis curves and bi-cubic surfaces, the results can be easily extended to any other degree.

Figure 1:
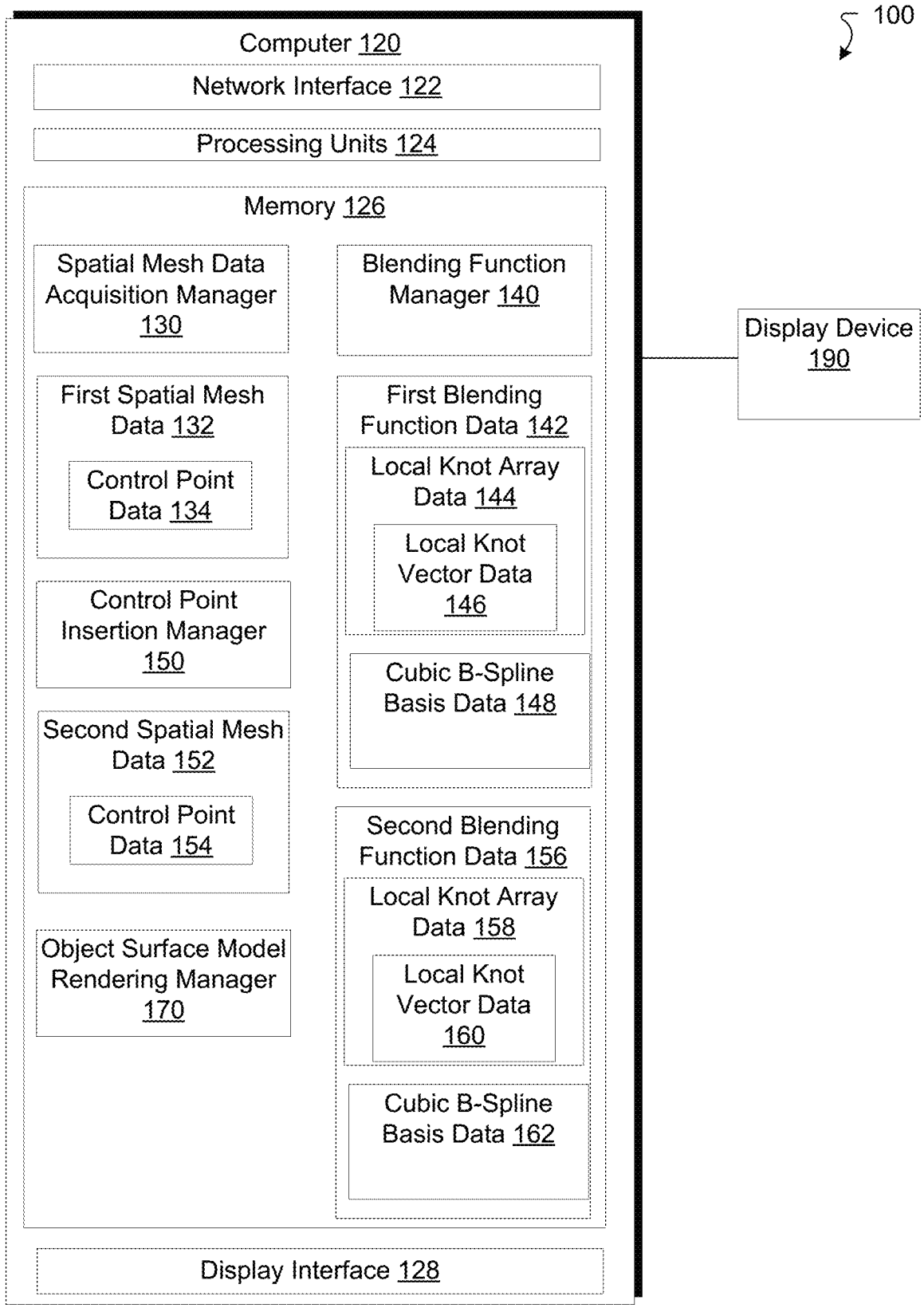
FIG. 1 is a diagram that illustrates an example electronic environment in which improved techniques described herein may be implemented.

FIG. 1 is a diagram that illustrates an example electronic environment 100 (e.g., device or set of devices) in which the above-described improved techniques may be implemented. As shown, in FIG. 1, the electronic environment 100 includes a computer 120 and a display 190.

The computer 120 is configured to generate a surface model representing an object for manufacture. The computer 120 includes a network interface 122, one or more processing units 124, memory 126, and a display interface 128. The set of processing units 124 and the memory 126 together form control circuitry, which is configured and arranged to perform various methods and functions as described herein.

In some embodiments, one or more of the components of the computer 120 can be, or can include processors (e.g., processing units 124) configured to process instructions stored in the memory 126. Examples of such instructions as depicted in FIG. 1 include a spatial mesh data acquisition manager 130, a blending function manager 140, a control point insertion manager 150, and an object surface model refinement manager 170. Further, as illustrated in FIG. 1, the memory 126 is configured to store various data, which is described with respect to the respective managers that use such data.

The spatial mesh data acquisition manager 130 is configured to receive first spatial mesh data 132 from any source of such data. In some implementations, the spatial mesh data acquisition manager 130 may be implemented as part of a software package used generally to model surfaces of manufacturable objects, such as a computer-aided design (CAD) program. In some implementations, the spatial mesh data acquisition manager 130 is configured to acquire the first spatial mesh data 132 over the network interface 122 from an external application.

The first spatial mesh data 132 nominally includes three-dimensional point, edge, and face data that defines a spatial mesh. For the purposes of the discussion herein, however, the first spatial mesh data 132 includes control point data 134 that represents the control points defining a surface of an object of manufacture. Each control point represented by the first control point data 132 has a respective spatial position and corresponds to a respective B-spline blending function. For example, the object in question may be a flat-surfaced material subject to damage simulated by a diffuse fracture process. Given such an object and damage model, the control point data 134 may be used to predict how the damage propagates through the object over time and in a steady state.

The blending function manager 140 is configured to compute values of B-spline blending functions corresponding to the control points defining an S-spline surface to produce first blending function data 142. To understand the nature of S-spline surfaces and the first blending function data 142, S-spline curves are discussed.

An S-spline curve is given by $$P(t) = \frac{\sum_{i=1}^{n} P_i B_i(t)}{\sum_{i=1}^{n} B_i(t)}, \quad (1)$$

where $$B_i(t) = \beta_i B_{t_i}(t), \quad (2)$$

$\beta_i$ is a scalar constant, and $B_{t_i}(t)$ is a cubic B-spline basis function defined by a local knot vector $t_i = [t_{\tau_i^0}, t_{\tau_i^1}, t_{\tau_i^2}, t_{\tau_i^3}, t_{\tau_i^4}]$. A conventional cubic B-spline curve is a special of an S-spline curve for which $$\tau_i^1 = \tau_{i+1}^0, \tau_i^2 = \tau_{i+1}^1, \tau_i^3 = \tau_{i+1}^2, \tau_i^4 = \tau_{i+1}^3, \, i=1, \ldots, n-1.= \quad (3)$$

The string of five increasing integers $\tau_i = [\tau_i^0, \tau_i^1, \tau_i^2, \tau_i^3, \tau_i^4,]$ is called the knot index vector of $t_i$. $B_{t_i}(t)$ can be evaluated using the de Boor algorithm, or, using the notation $(j, k) = (t_{\tau_i^j} - t_{\tau_i^k})$, $(t, j) = (t - t_{\tau_i^j})$, and $(j, t) = (t_{\tau_i^j} - t)$, $B_{t_i}(t)$ can be written explicitly as $$B_{t_i}(t) = \begin{cases} 0, & t \leq t_{\tau_i^0} \text{ or } t \geq t_{\tau_i^4} \\ (t, 0)^3 (3, 0)(2, 0)(1, 0), & t \in [t_{\tau_i^0}, t_{\tau_i^1}] \\ (t, 1)^2 (4, 1)(3, 1)(2, 1) + \\ (t, 1)(t, 0)(3, 0)(3, 1)(2, 1) + & t \in [t_{\tau_i^1}, t_{\tau_i^2}] \\ (2, t)(t, 0)^2 (3, 0)(2, 0)(2, 1), \\ (3, t)^2 (t, 0)(3, 0)(3, 1)(3, 2) + \\ (3, t)(4, t)(t, 1)(4, 1)(3, 1)(3, 2) + & t \in [t_{\tau_i^2}, t_{\tau_i^3}] \\ (t, 2)(4, t)^2 (4, 1)(4, 2)(3, 2), \\ (4, t)^3 (4, 1)(4, 2)(4, 3), & t \in [t_{\tau_i^3}, t_{\tau_i^4}] \end{cases} \quad (4)$$

where care can be taken for multiple knots. $\tau_i^2$ is called the central knot index for $t_i$ and $t_{\tau_i^2}$ is the central knot of $B_{t_i}(t)$. In some implementations, no two knot index vectors have the same central index.

Given the above, the first blending function data 142 includes local knot array data 144 and cubic B-spline basis data 148. The local knot array data 144 includes local knot vector data 146 representing a local knot vector $t_i$, which, given that the blending functions are based on B-spline basis functions, defines particular B-spline basis functions. When the B-spline blending functions define a surface, the local knot array data 144 represents a pair of knot vectors, each represented by local knot vector data 146. In some implementations, a local knot vector $t_i$ may be defined in turn by the knot index vector $\tau_i$. The cubic B-spline basis data 148 represent the B-spline basis function values as defined in Eq. (4). The cubic B-spline basis data 148 includes any number of samples of the object surface based on the surface model from Eq. (4).

The control point insertion manager 150 is configured to perform a control point insertion operation at a specified position to produce second spatial mesh data 154, including control point data 154, and second blending function data 156. For the S-spline surfaces described here, exact local refinement means that only a specified number of control points need to be inserted in a control point insertion operation to represent the same surface as that represented by the control point data 134. No additional control points are generated in addition to those specified.

The control point insertion manager 150 is also configured to perform a refinement operation on each of the specified number of B-spline blending functions to produce the second blending function data 156. The second blending function data 156 includes local knot array data 158, including local knot vector data 160, and cubic B-spline basis data 162, analogous to the first blending function data 142. In some implementations, the second blending function data 156 includes information about only those blending functions that have been refined, i.e., corresponding to the specified number of control points adjacent to the additional control point. Further details about how the B-spline blending functions are refined are described herein.

The object surface model rendering manager 170 is configured to render, onto the display device 190 via the display interface 128, the object surface as approximated by the individual B-spline blending functions that form the S-spline surface, as represented by the first and second blending function data 142 and 156, respectively.

Figure 2:
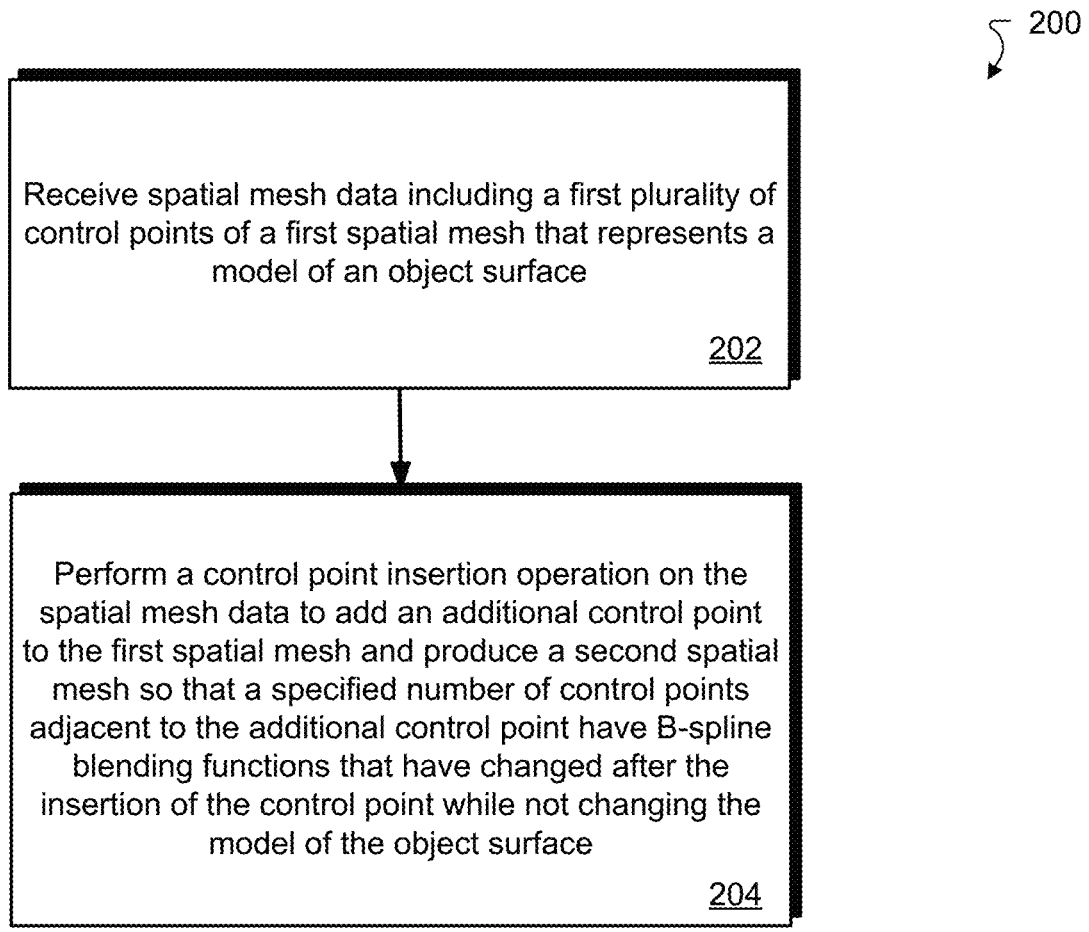
FIG. 2 is a flow chart illustrating an example method of performing the improved techniques within the electronic environment illustrated in FIG. 1.

FIG. 2 is a flow chart depicting an example method 200 of refining a model of a complex surface. The method 200 may be performed by software constructs described in connection with FIG. 1, which reside in memory 126 of the computer 120 and are run by the set of processing units 124.

At 202, the spatial mesh data acquisition manager 130 receives first spatial mesh data 132 representing a first spatial mesh, the first spatial mesh including a first plurality of control points (e.g., control point data 134), each of the first plurality of control points having a respective spatial position and corresponding to a respective B-spline blending function of a first plurality of B-spline blending functions (e.g., first blending function data 142), each of the plurality of first B-spline blending functions being defined by a respective local knot array (e.g., local knot array data 144) and representing the surface model.

At 204, the control point insertion manager 150 performs a control point insertion operation on the spatial mesh data to add an additional control point to the first spatial mesh and produce a second spatial mesh, the second spatial mesh including a second plurality of control points (e.g., control point data 154), the second plurality of control points including the first plurality of control points and the additional control point, each of the second plurality of control points having a respective spatial position and corresponding to a respective B-spline blending function of a second plurality of B-spline blending functions (e.g. second blending function data '56), the respective B-spline blending functions of the second plurality of B-spline blending functions to which a specified number of control points of the second plurality of control points adjacent to the additional control point correspond being defined by a respective local knot array (e.g., local knot array data 158) different from the respective local knot array of a B-spline blending function of the first plurality of B-spline blending functions having the same spatial position, the respective B-spline blending functions of the second plurality of B-spline blending functions to which the other control points of the second plurality of control points correspond being defined by a respective local knot array that is the same as the respective local knot array of a B-spline blending function of the first plurality of B-spline blending functions having the same spatial position.

Figure 3A:
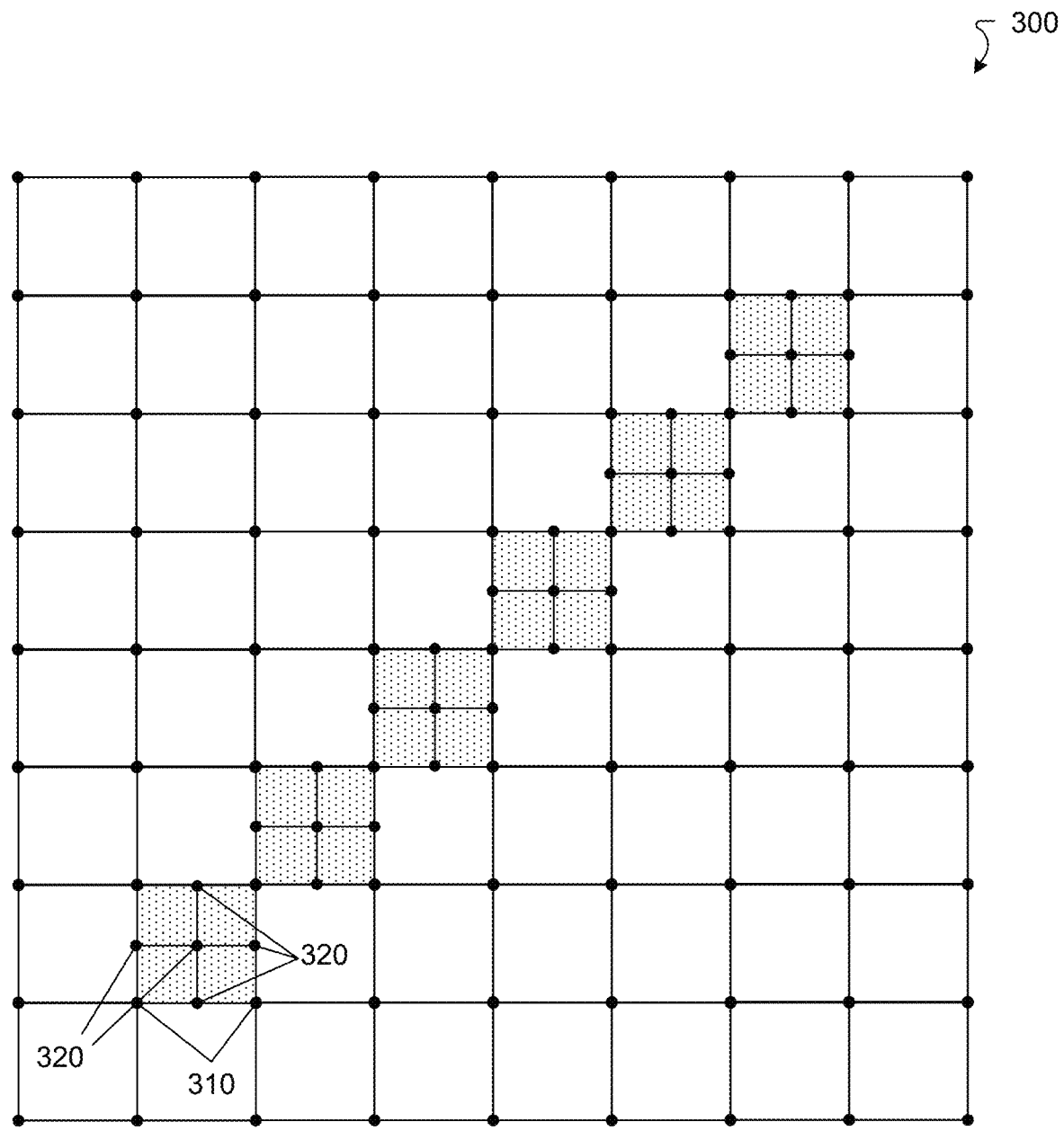
FIG. 3A is a diagram illustrating an example grid of control points with added control points to be inserted.

FIG. 3A is a diagram illustrating an example grid 300 of control points (e.g., control points 310) with added control points (e.g., added control points 320) to be inserted. Ideally, these added control points 320 are the only control points that should be added. Nevertheless, the requirement of exact refinement can result in the addition of further control points in excess of those specified. While T-splines refinement is more local than NURBS refinement, it nonetheless generates additional, unrequested control points in all but the simplest cases. Figure 0.a shows an initial control grid of black control points into which we desire to insert the red control points via a local refinement algorithm.

Figure 3B:
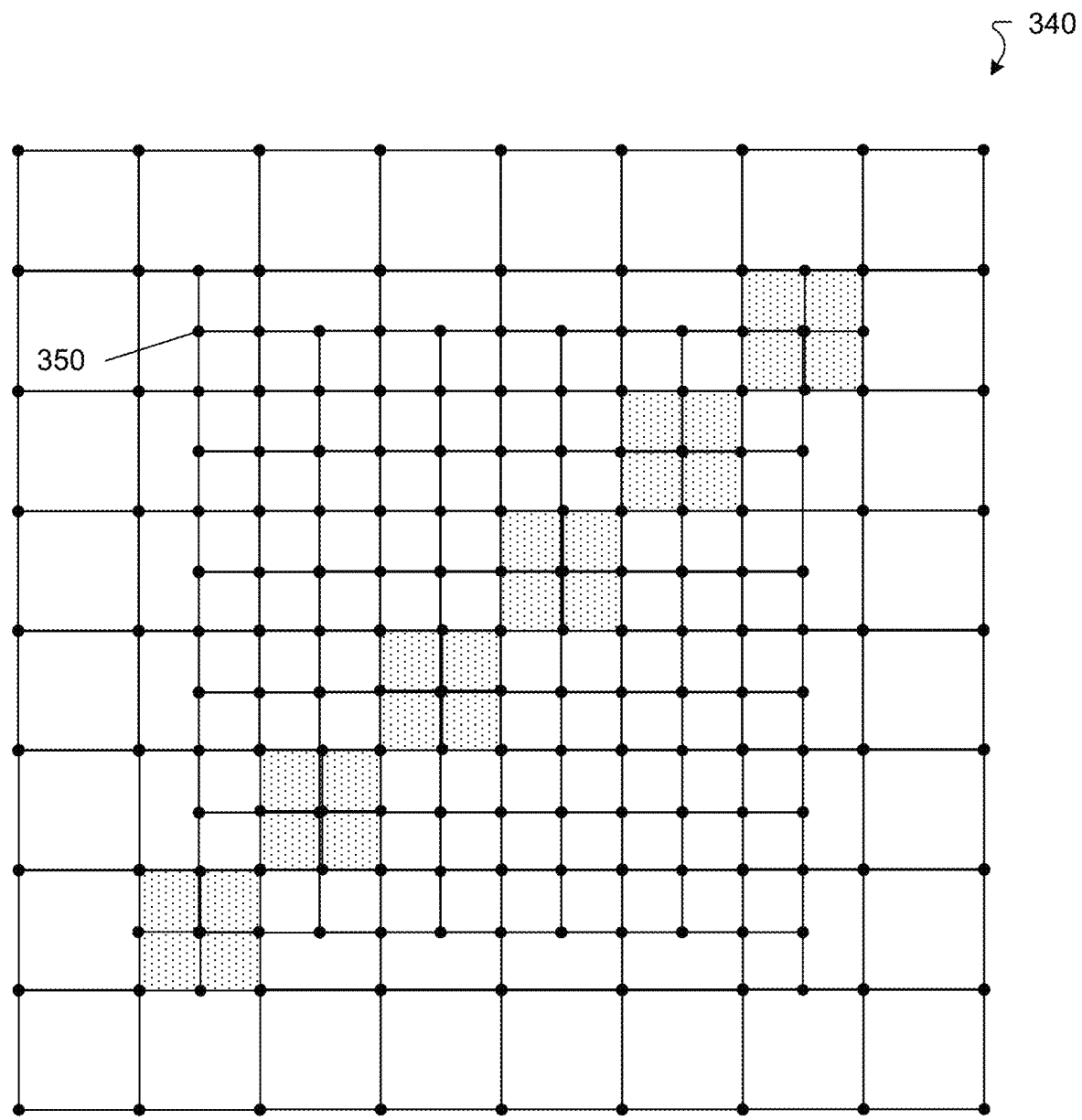
FIG. 3B is a diagram illustrating an example grid of control points with extra control points added to maintain the surface shape.
Figure 3C:
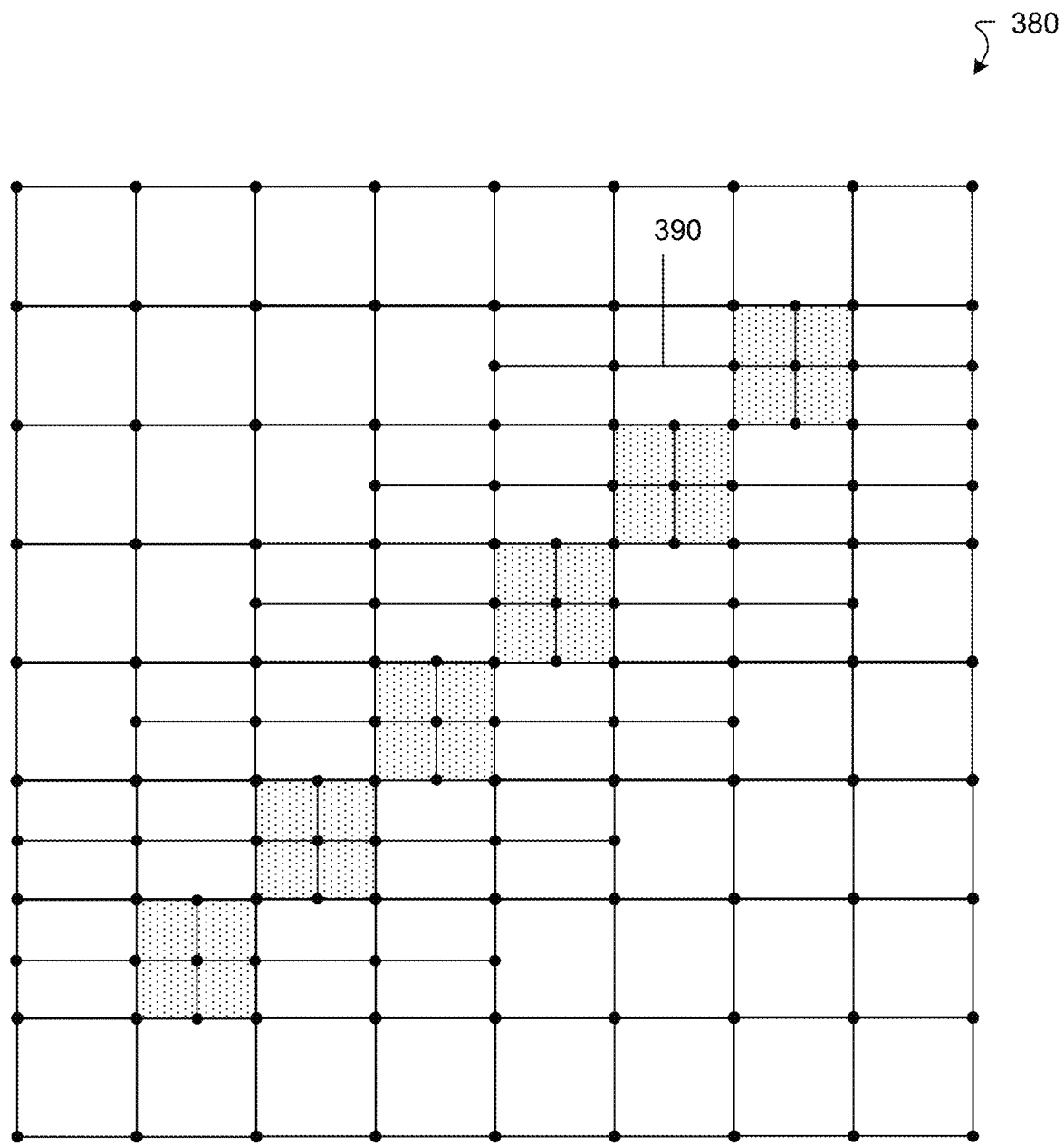
FIG. 3C is a diagram illustrating another example grid of control points with extra control points added to maintain the surface shape.

FIG. 3B is a diagram illustrating an example grid 340 of control points with extra control points (e.g., control points 350) added for exact refinement. FIG. 3B shows the result obtained from an implementation of the T-splines local refinement algorithm. FIG. 3C is a diagram illustrating another example grid 380 of control points with extra control points (e.g., on a line 390) added for exact refinement. FIG. 3C shows the result using another analysis-suitable T-spline local refinement algorithm. In both cases, some unrequested control points (points 350 and line 390) can be added to achieve exact refinement. This propagation of unwanted control points in exact refinement occurs in all previous variations of T-splines, including analysis-suitable T-splines, Modified T-splines, Weighted T-splines, and Truncated T-splines.

Figure 4A:
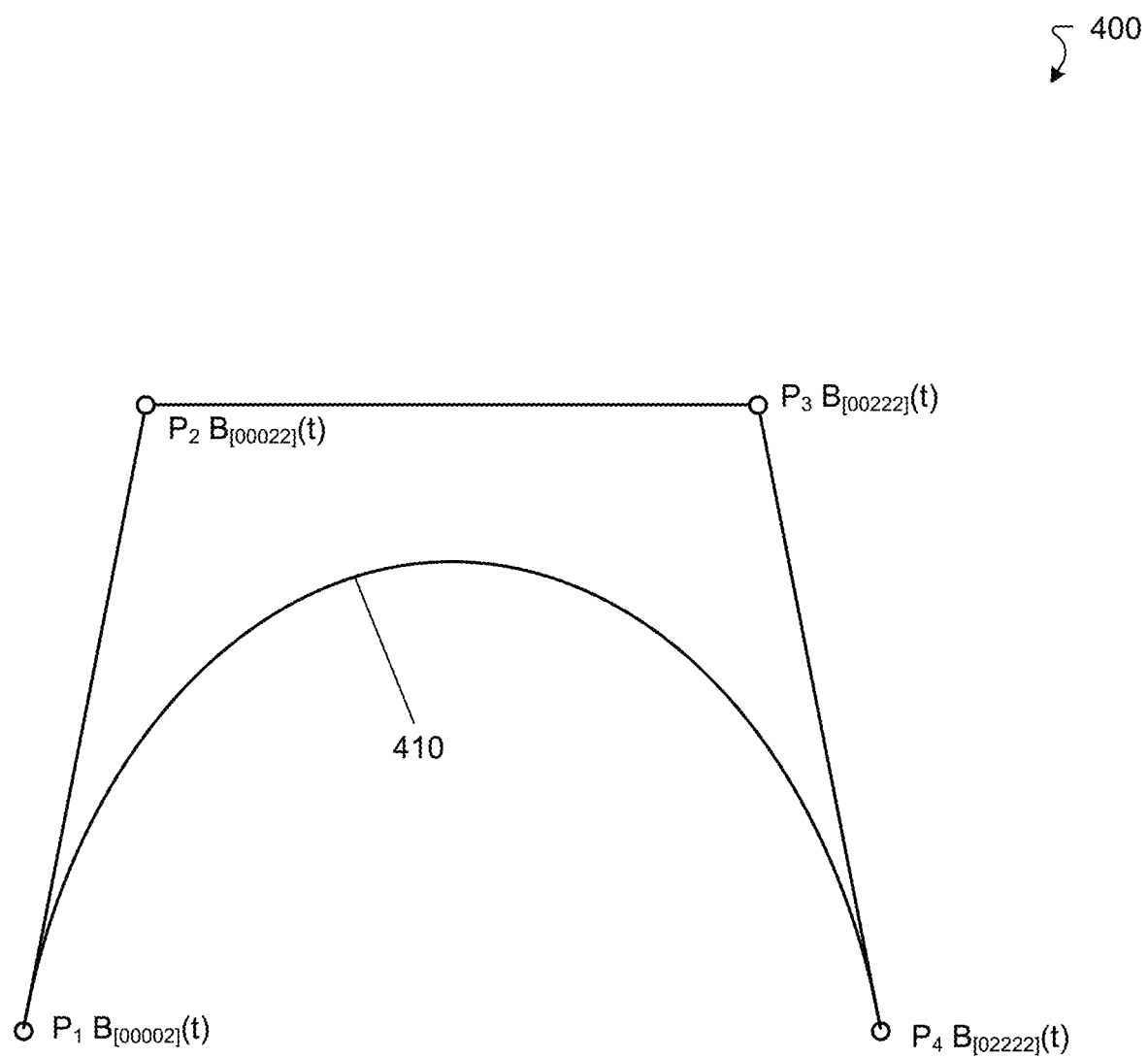
FIG. 4A is a diagram illustrating an example B-spline curve before control point/knot insertion.

FIG. 4A is a diagram illustrating an example conventional B-spline curve 400 before control point/knot insertion. To understand the issues involved in performing control point insertion operations with exact local refinement of B-spline basis function 410, conventional B-spline basis function refinement is reviewed.

Recall that for a B-spline basis function with local knot vector $t_i = [t_{\tau_i}^0, t_{\tau_i}^1, t_{\tau_i}^2, t_{\tau_i}^3, t_{\tau_i}^4]$, a knot $t_a \in (t_{\tau_i}^0, t_{\tau_i}^4)$ can be inserted to yield $$B_{[t_{\tau_i}^0, t_{\tau_i}^1, t_{\tau_i}^2, t_{\tau_i}^3, t_{\tau_i}^4]}(t) = c_1 B_{[t_{\tau_i}^0, t_{\tau_i}^1, t_{\tau_i}^2, t_{\tau_i}^3 | t_a]}(t) + c_2 B_{[t_{\tau_i}^1, t_{\tau_i}^2, t_{\tau_i}^3, t_{\tau_i}^4 | t_a]}(t), \quad (5)$$

where $[t_{\tau_i}^0, t_{\tau_i}^1, t_{\tau_i}^2, t_{\tau_i}^3 | t_a]$ denotes inserting $t_a$ into its proper position in the knot vector $[t_{\tau_i}^0, t_{\tau_i}^1, t_{\tau_i}^2, t_{\tau_i}^3]$, and $$c_1 = \begin{cases} \frac{t_a - t_{\tau_i}^0}{t_{\tau_i}^3 - t_{\tau_i}^0} & t_{\tau_i}^1 < t_a < t_{\tau_i}^3 \\ 1 & t_a \geq t_{\tau_i}^3 \end{cases} \quad c_2 = \begin{cases} \frac{t_{\tau_i}^4 - t_a}{t_{\tau_i}^4 - t_{\tau_i}^1} & t_a > t_{\tau_i}^1 \\ 1 & t_a \leq t_{\tau_i}^1 \end{cases}.$$

Using the shorthand notation $\langle 12345 \rangle \equiv B_{[t_1, t_2, t_3, t_4, t_5]}(t)$, a conventional cubic B-spline curve with knot vector $[t_1, t_2, t_3, t_4, t_6, t_7, t_8, t_9]$ can be written $$P(t) = \langle 12346 \rangle P_1 + \langle 23467 \rangle P_2 + \langle 34678 \rangle P_3 + \langle 46789 \rangle P_4. \quad (6)$$

If a knot $t_5$ is inserted, the equation of the refined curve is $$\overline{P}(t) = \langle 12345 \rangle \overline{P}_1 + \langle 23456 \rangle \overline{P}_2 + \langle 34567 \rangle \overline{P}_3 + \langle 45678 \rangle \overline{P}_4 + \langle 56789 \rangle \overline{P}_5$$

To ensure $\overline{P}(t) = P(t)$, the values of the $\overline{P}_i$ are determined by applying (5) to each of the blending functions of $P(t)$ and collecting terms:

$$
\begin{aligned}
P(t) & & & (7)\\
&= \langle 12346 \rangle P_1 &= \langle 12345 \rangle P_1 &+ \frac{t_6 - t_5}{t_6 - t_2}\langle 23456 \rangle P_1 \\
&+ \langle 23467 \rangle P_2 & &+ \frac{t_5 - t_2}{t_6 - t_2}\langle 23456 \rangle P_2 + \frac{t_7 - t_5}{t_7 - t_3}\langle 34567 \rangle P_2 \\
&+ \langle 34678 \rangle P_3 & & + \frac{t_5 - t_3}{t_7 - t_3}\langle 34567 \rangle P_3 + \frac{t_8 - t_5}{t_8 - t_4}\langle 45678 \rangle P_3 \\
&+ \langle 46789 \rangle P_4 & & \quad\quad + \frac{t_5 - t_4}{t_8 - t_4}\langle 45678 \rangle P_4 + \langle 56789 \rangle P_4 \\
&= \overline{P}(t) &= \langle 12345 \rangle \overline{P}_1 &+ \langle 23456 \rangle \overline{P}_2 \quad + \langle 34567 \rangle \overline{P}_3 \quad\quad + \langle 45678 \rangle \overline{P}_4 \quad + \langle 56789 \rangle \overline{P}_5
\end{aligned}
$$

From Eq. (7) it may be seen that $\overline{P}(t) = P(t)$ if $\overline{P}_1 = P_1$, $$\overline{P}_2 = \frac{t_6 - t_5}{t_6 - t_2} P_1 + \frac{t_5 - t_2}{t_6 - t_2} P_2, \quad \overline{P}_3 = \frac{t_7 - t_5}{t_7 - t_3} P_2 + \frac{t_5 - t_3}{t_7 - t_3} P_3,$$

$$\overline{P}_4 = \frac{t_8 - t_5}{t_8 - t_4} P_3 + \frac{t_5 - t_4}{t_8 - t_4} P_4, \quad \overline{P}_5 = P_4.$$

FIG. 4A shows a B-spline curve with knot vector [0,0,0,0, 2,2,2,2].

Figure 4B:
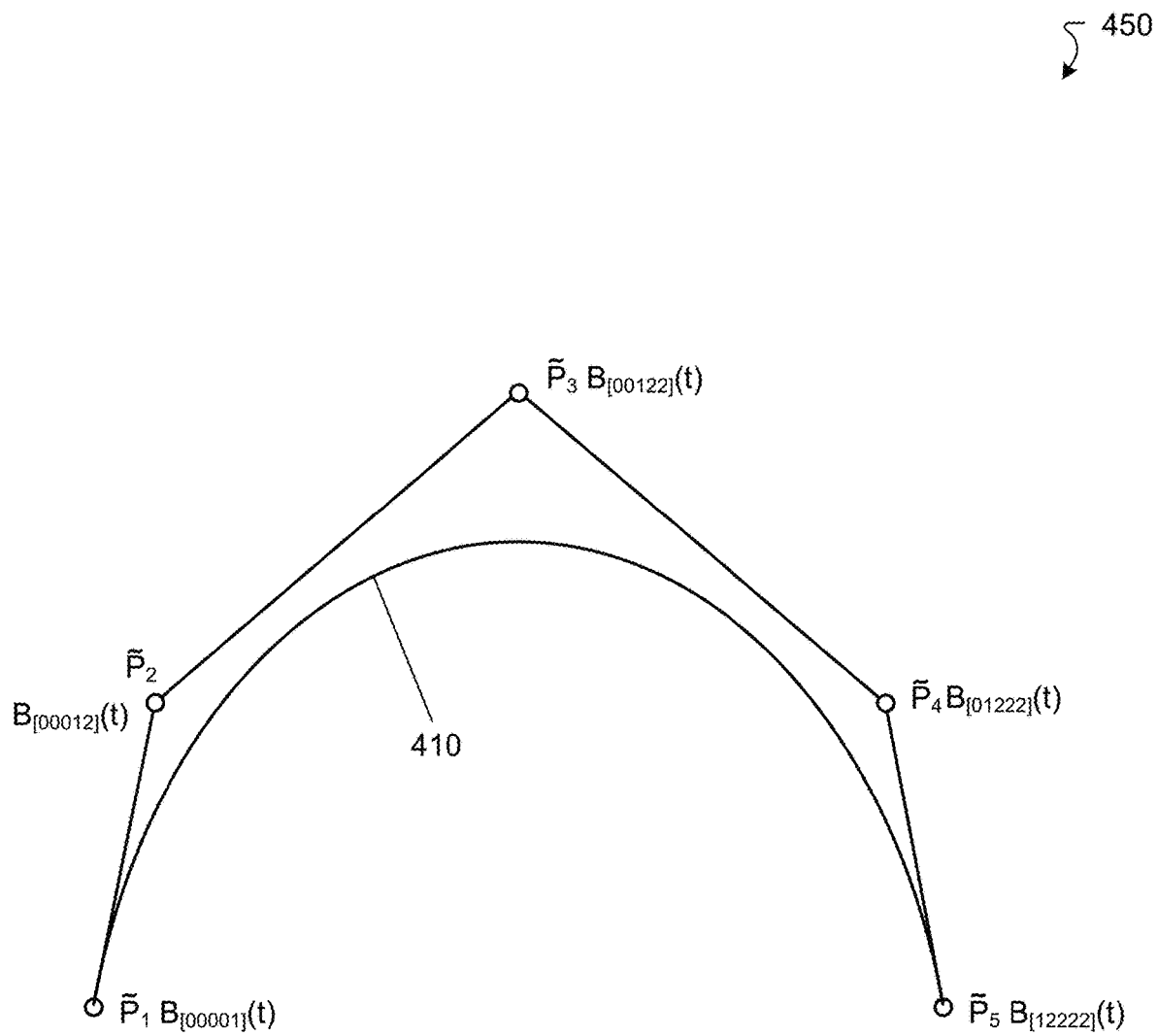
FIG. 4B is a diagram illustrating an example B-spline curve after control point/knot insertion.

FIG. 4B is a diagram illustrating an example B-spline curve 450 after control point/knot insertion. FIG. 4B shows that curve after conventional B-Spline refinement has been performed by inserting a knot at t=1. Note that all of the B-spline blending functions have been refined, subject to the constraint of Eq. (3), i.e., that the curves are NURBS.

It is noted that the primary use of B-spline refinement is to create more degrees of freedom. Artists use those degrees of freedom to create a more detailed design, and IGA uses them to decrease approximation error. Equation (7) states that inserting a knot into a cubic B-spline curve involves refining all four blending functions; similarly, refinement of T-spline surfaces involves refinement of numerous blending functions. The development of S-splines was motivated by the simple but powerful observation that extra degrees of freedom can be obtained by refining as few as one or two blending functions, and that, while the resulting curve or surface is not a conventional NURBS, it can be useful for CAD or IGA.

As stated above, S-splines curves, in contrast to conventional B-spline curves, achieve exact local refinement by specifying the number of control points for which B-spline blending functions to which those control points correspond are refined. The specification of which control points, and how many such points, is expressed in a refinement class. A Class i refinement is defined as a refinement involving the refinement of i B-spline blending functions. A subscript on the i denotes the knot index vector component(s) of the B-spline basis functions are refined.

Figure 5A:
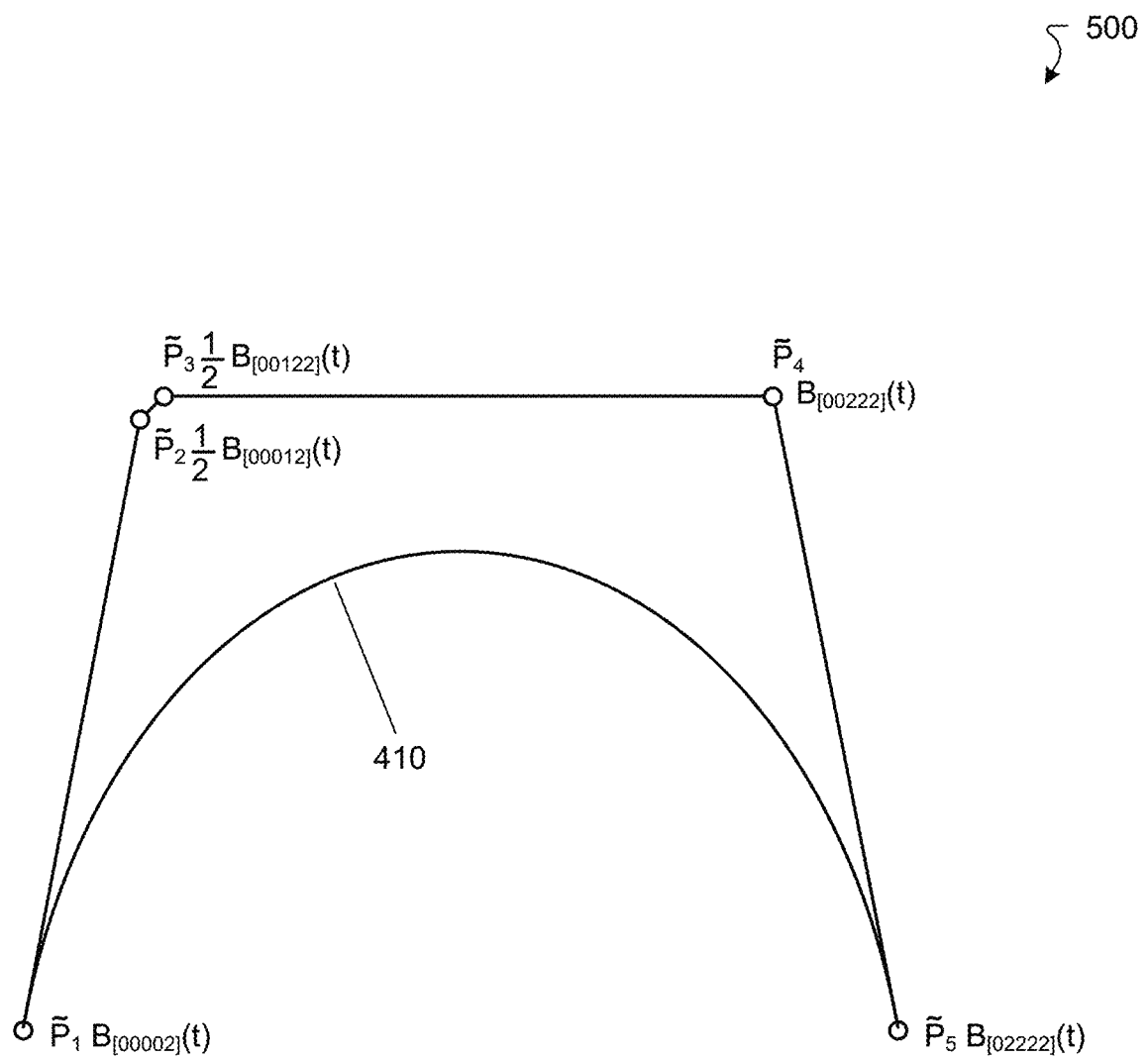
FIG. 5A is a diagram illustrating an example S-spline curve obtained by Class $1_2$ refinement.

FIG. 5A is a diagram illustrating an example S-spline curve 500 obtained by Class $1_2$ refinement. That is, FIG. 5A shows the result of refining only $B_2(t)$ for the B-spline curve in FIG. 4A and expressing the resulting curve in S-spline form. Note that the additional control point is located at the same location as the control point $P_2$, i.e., the control point $P_2$ is split, and each of the pair of points resulting from the split corresponds to different B-spline blending functions <00122> and <00012>. The factors of are to preserve the partition of unity.

Figure 5B:
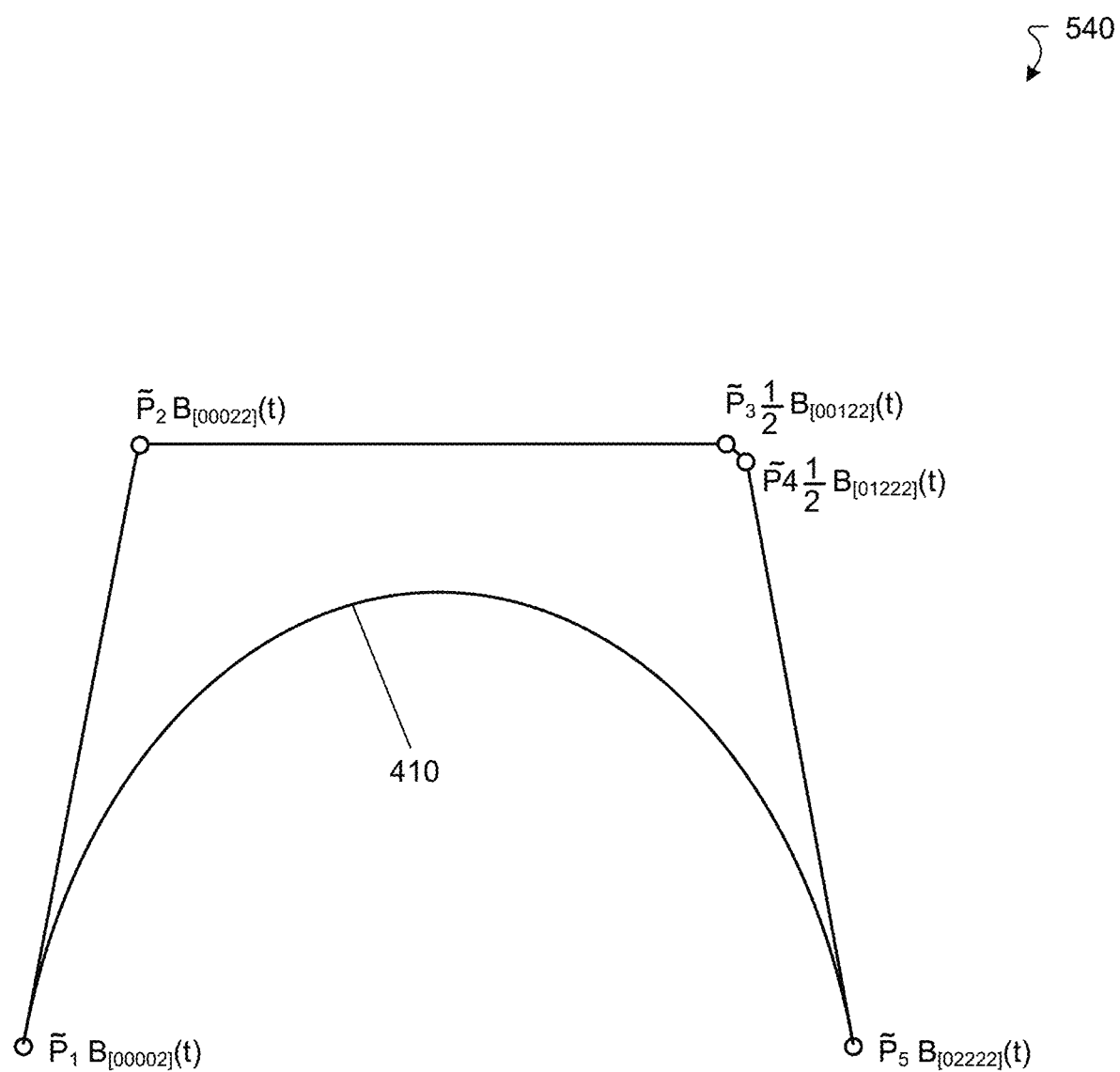
FIG. 5B is a diagram illustrating an example S-spline curve obtained by Class $1_3$ refinement.

FIG. 5B is a diagram illustrating an example S-spline curve 540 obtained by Class $1_3$ refinement. That is, FIG. 5B shows the result of refining only $B_3(t)$ for the B-spline curve in FIG. 4A and expressing the resulting curve in S-spline form. Note that the additional control point is located at the same location as the control point $P_3$, i.e., the control point $P_3$ is split, and each of the pair of points resulting from the split corresponds to different B-spline blending functions <00122> and <01222>. The factors of ½ are to preserve the partition of unity.

Figure 5C:
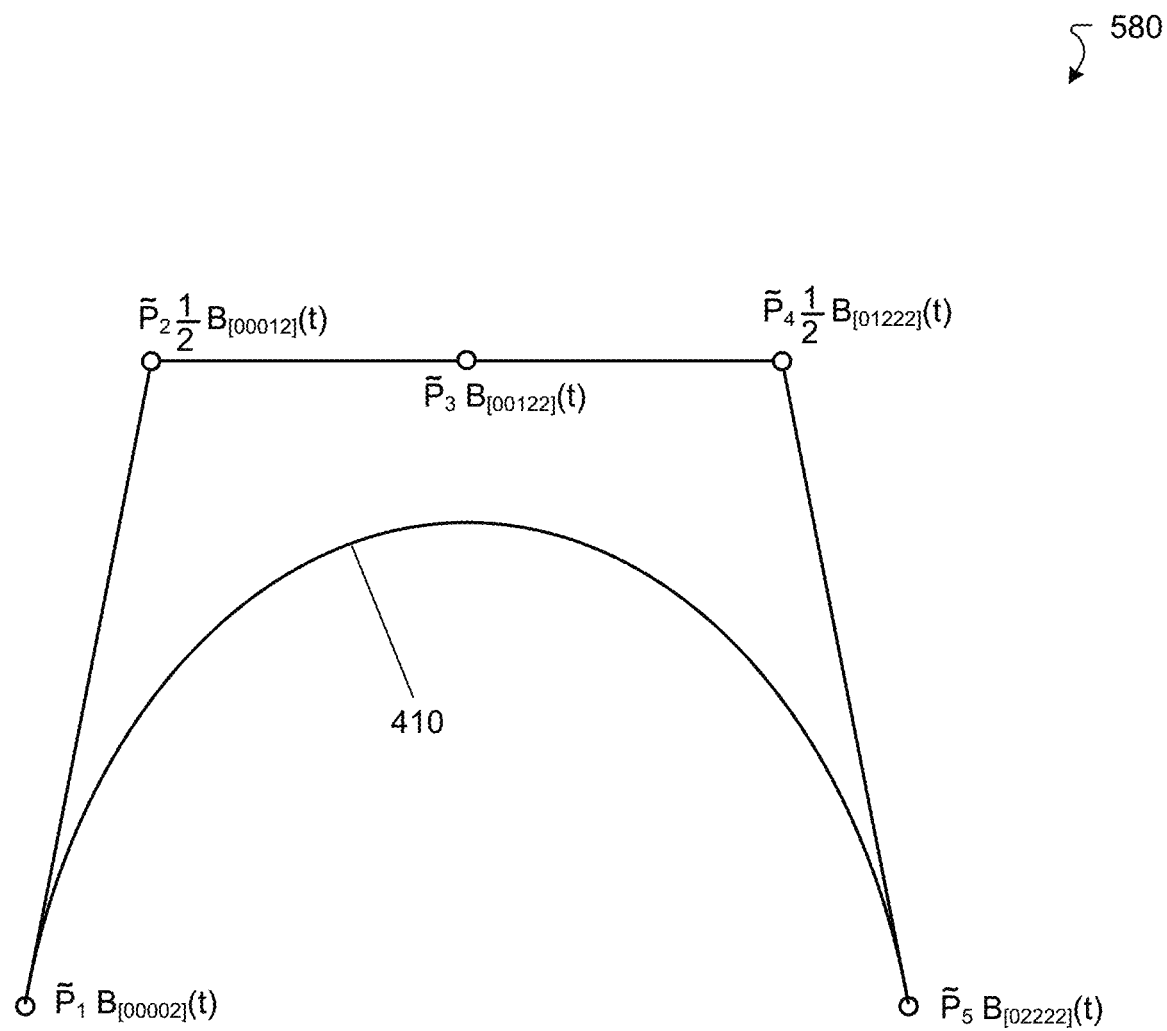
FIG. 5C is a diagram illustrating an example S-spline curve obtained by Class $2_{2,3}$ refinement.

FIG. 5C is a diagram illustrating an example S-spline curve 580 obtained by Class $2_{2,3}$ refinement. That is, FIG. 5B shows the result of refining both $B_2(t)$ and $B_3(t)$ for the B-spline curve in FIG. 4A and expressing the resulting curve in S-spline form. Note that the additional control point is located halfway between the control points $P_2$ and $P_3$. each of the pair of points resulting from the split corresponds to different B-spline blending functions <00012> and <01222>. The factors of ½ are to preserve the partition of unity.

In FIGS. 4A-5C, each control point label is followed by the blending function for that control point. By comparing equations before and after refinement as in Eq. (7), it is noted that the curve in FIG. 5A is identical to the curve in FIG. 4A if $\tilde{P}_1=P_1$, $\tilde{P}_2=P_2$, $\tilde{P}_3=P_2$, $\tilde{P}_4=P_3$, $\tilde{P}_5=P_4$. Likewise, the curve in FIG. 5B is identical to the curve in FIG. 4A if $\tilde{P}_1=P_1$, $\tilde{P}_2=P_2$, $\tilde{P}_3=P_3$, $\tilde{P}_4=P_3$, $\tilde{P}_5=P_4$. The curve in FIG. 5C is identical to the curve in FIG. 4A if $\tilde{P}_1=P_1$, $\tilde{P}_2=P_2$, $\tilde{P}_3=(P_2+P_3)/2$, $\tilde{P}_4=P_3$, $\tilde{P}_5=P_4$.

Note that the curves in FIGS. 5A-5C are not expressible in conventional B-spline form because the blending functions do not satisfy (3), but they are expressible in S-spline form.

Refinement involving the splitting of i=1, . . . ,4 blending functions will be referred to as Class i refinement, and subscripts such as in Class $1_2$ and Class $2_{2,3}$ indicate which blending functions are split to create the S-spline curve. Conventional B-spline curve refinement is Class 4.

FIGS. 6A-6D show S-spline curves based on the control polygon but with blending functions from different classes. The curves from Class 1 and 2 lie further from the control polygon than the B-spline curve, because some of the blending functions have β=0.5. The blending functions for Class 1 are not symmetric, but they have a useful property that B-spline curves do not: vector $P_3$-$P_2$ for Class $1_2$, and vector $P_3$-$P_4$ for Class $1_4$, are proportional to the jump in third derivative across the knot that appears in their respective blending functions only. Thus, if those vectors are length zero, the knot can be removed. Note that in FIGS. 6A-6D, the curves have the same control points, but blending functions from different classes.

Figure 6A:
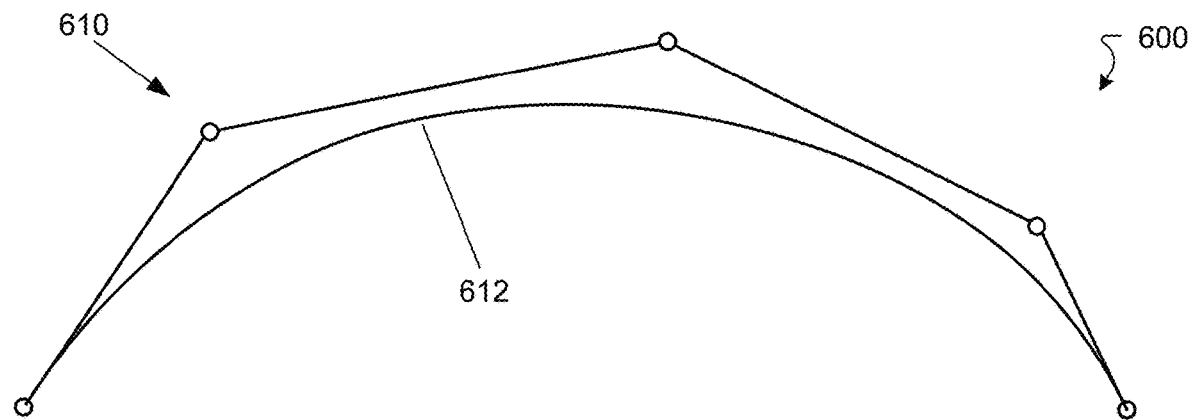
FIG. 6A is a diagram illustrating an example B-spline curve with global knot vector [0,0,0,0,1,2,2,2,2].
Figure 6B:
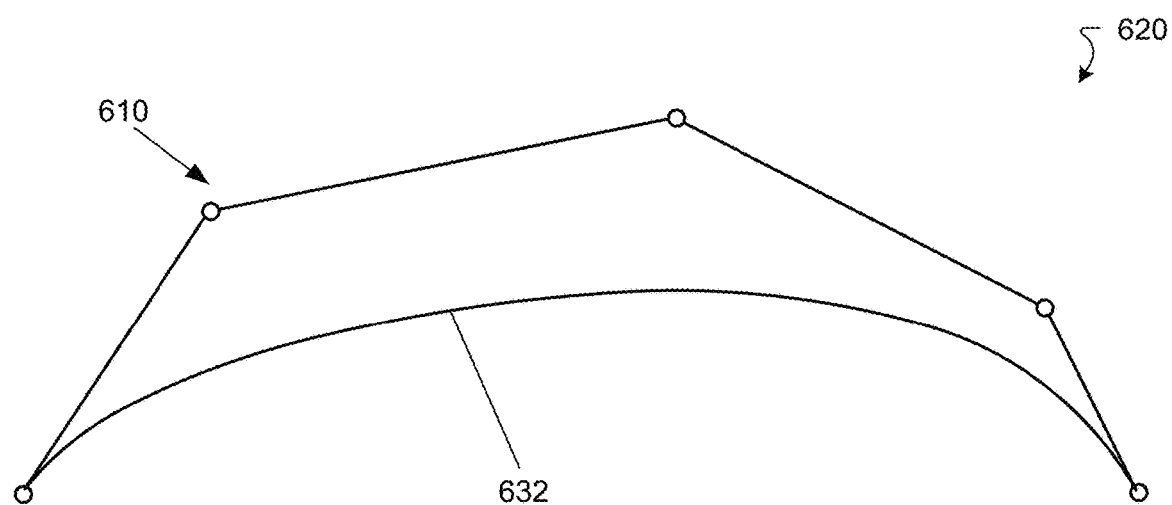
FIG. 6B is a diagram illustrating an example S-spline curve with global knot vector [0,0,0,0,1,2,2,2,2] obtained from a Class $1_2$ refinement.
Figure 6C:
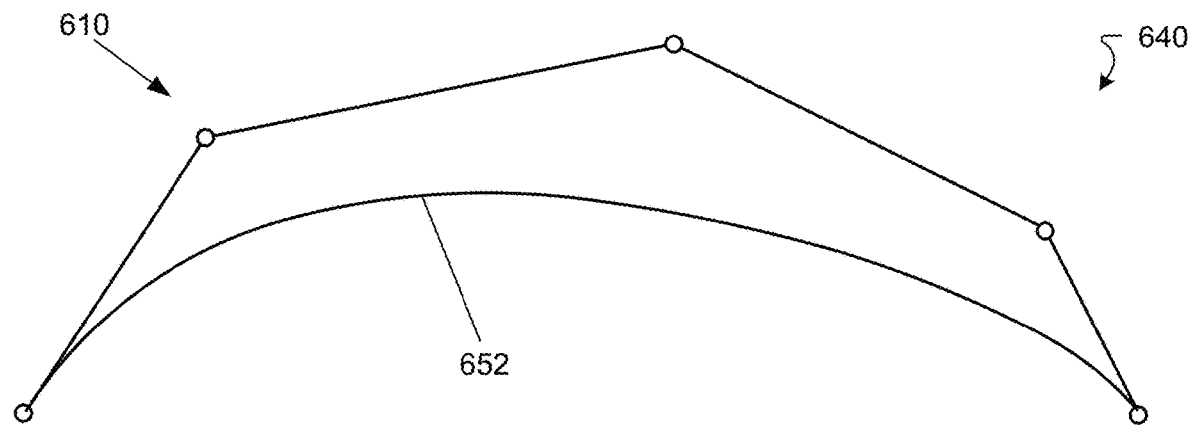
FIG. 6C is a diagram illustrating an example S-spline curve with global knot vector [0,0,0,0,1,2,2,2,2] obtained from a Class $1_3$ refinement.
Figure 6D:
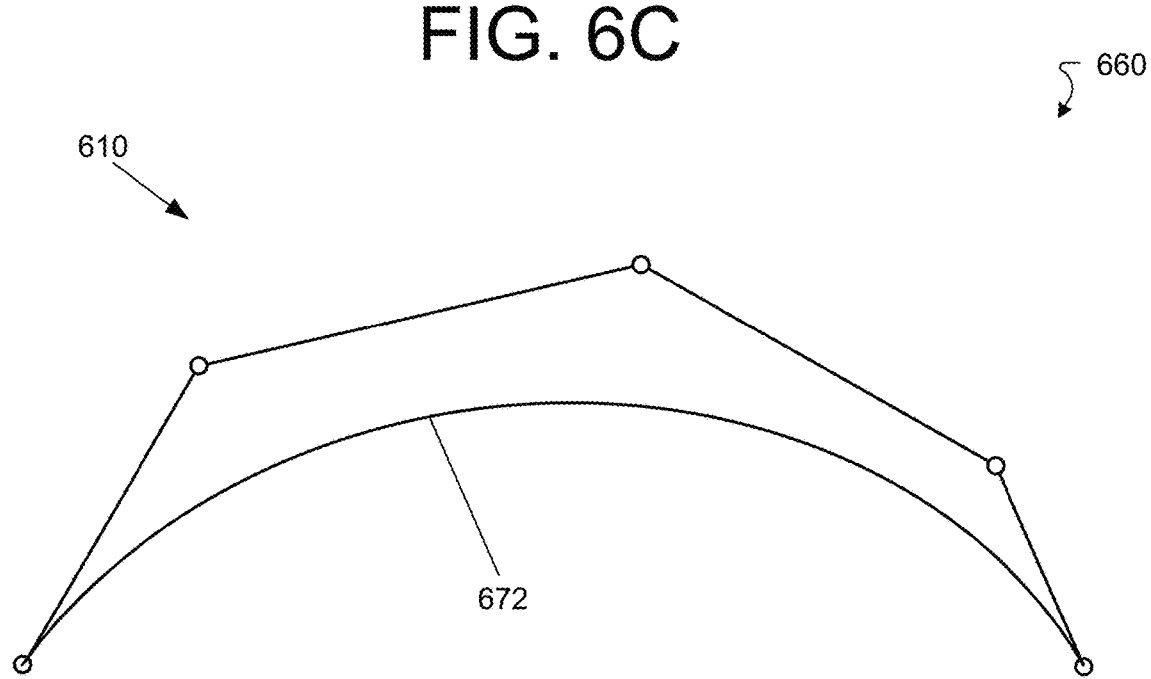
FIG. 6D is a diagram illustrating an example S-spline curve with global knot vector [0,0,0,0,1,2,2,2,2] obtained from a Class $2_{2,3}$ refinement.

FIG. 6A is a diagram illustrating an example B-spline curve 600 with global knot vector [0,0,0,0,1,2,2,2,2]. FIG. 6B is a diagram illustrating an example S-spline curve 620 with global knot vector [0,0,0,0,1,2,2,2,2] obtained from a Class $1_2$ refinement. FIG. 6C is a diagram illustrating an example S-spline curve 640 with global knot vector [0,0,0, 0,1,2,2,2,2] obtained from a Class $1_3$ refinement. FIG. 6D is a diagram illustrating an example S-spline curve 660 with global knot vector [0,0,0,0,1,2,2,2,2] obtained from a Class $2_{2,3}$ refinement.

Figure 7A:
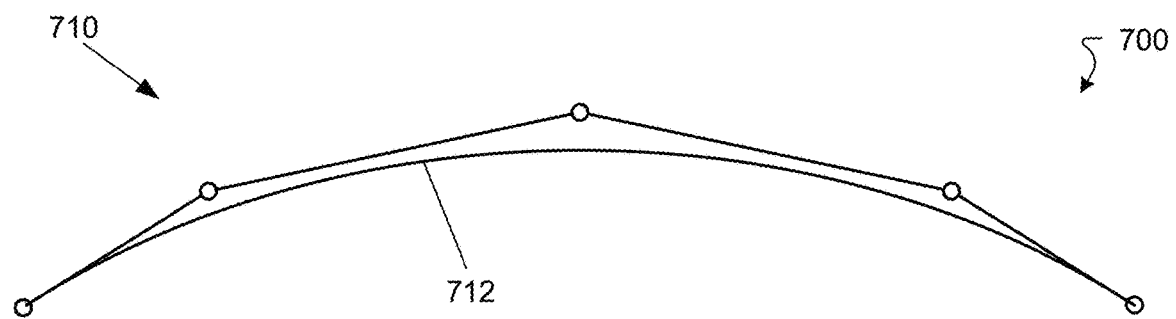
FIG. 7A is a diagram illustrating another example B-spline curve with global knot vector [0,0,0,0,1,2,2,2,2].
Figure 7B:
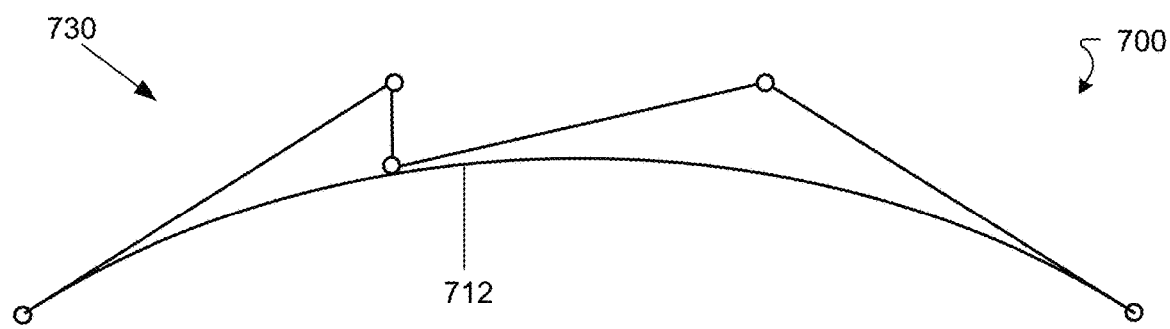
FIG. 7B is a diagram illustrating example S-spline curve with global knot vector [0,0,0,0,1,2,2,2,2] obtained from a Class $1_2$ refinement.
Figure 7C:
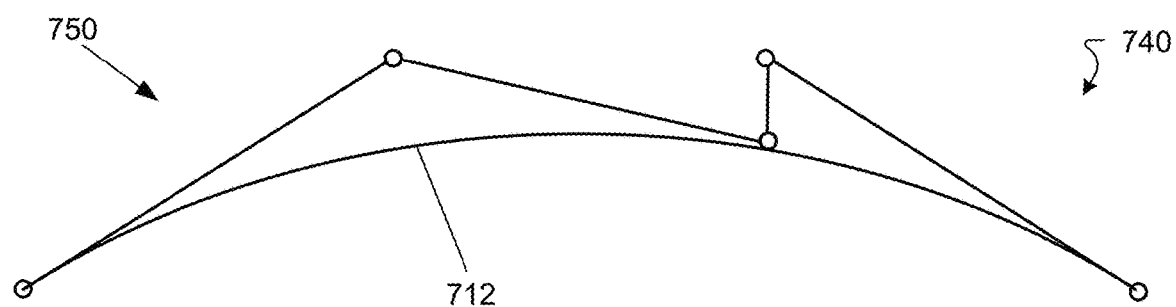
FIG. 7C is a diagram illustrating an example S-spline curve with global knot vector [0,0,0,0,1,2,2,2,2] obtained from a Class $1_3$ refinement.
Figure 7D:
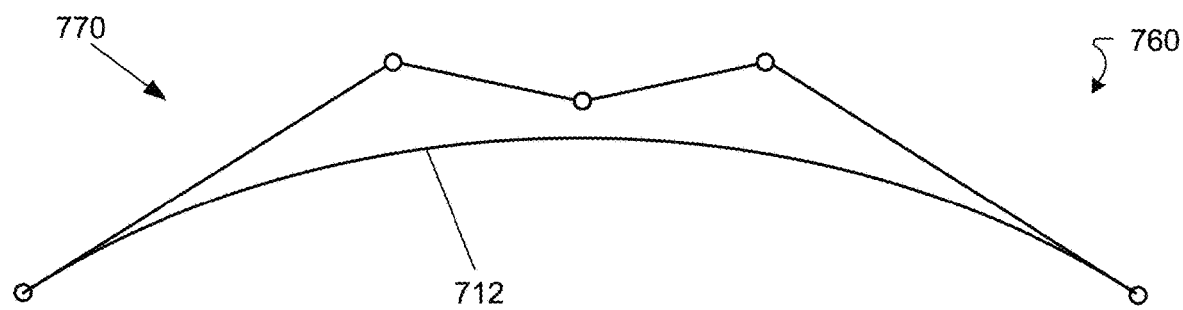
FIG. 7D is a diagram illustrating an example S-spline curve with global knot vector [0,0,0,0,1,2,2,2,2] obtained from a Class $2_{2,3}$ refinement.

The blending functions for the curves in FIGS. 4B and 5A-5C define the same spline space, so a curve created in any of these classes has an equivalent representation in each of the other classes. FIG. 7A shows a B-spline curve, and FIGS. 7B-7D show the same curve represented in different classes. All of these classes obey the convex hull property. Note that in FIGS. 6A-6D, the curves have the same control points, but blending functions from different classes.

FIG. 7A is a diagram illustrating another example B-spline curve 700 with global knot vector [0,0,0,0,1,2,2,2, 2]. FIG. 7B is a diagram illustrating example S-spline curve 720 with global knot vector [0,0,0,0,1,2,2,2,2] obtained from a Class $1_2$ refinement. FIG. 7C is a diagram illustrating an example S-spline curve 740 with global knot vector [0,0,0,0,1,2,2,2,2] obtained from a Class $1_3$ refinement. FIG. 7D is a diagram illustrating an example S-spline curve with global knot vector [0,0,0,0,1,2,2,2,2] obtained from a Class $2_{2,3}$ refinement.

In the examples it has been shown for Class i>1 refinement, i blending functions are split into two new blending functions, but only i+1 of those 2i blending functions are unique. For example, (7) shows a Class 4 refinement in which the four blending functions are each split to create eight blending functions, but only five are unique. This assures that if an S-spline curve with n control points is refined by inserting a single knot, the refined curve will have at most n+1 control points. If the refined curve were to have more than n+1 control points the new set of blending functions would not be linearly independent. A set of i blending functions which generate i+1 unique blending functions upon refinement is called refinement compatible. Any i adjacent blending functions for a B-spline curve are refinement compatible. In FIG. 5C, the two adjacent blending functions $B_{[00002]}(t)$ and $B_{[00012]}(t)$ are not refinement compatible, because insertion of a knot at, say, t=1.5 in each of those blending functions creates four unique blending functions, not three. These observations lead to the following Lemma.

Lemma 1 Given an S-spline curve S that has linearly independent blending functions, an S-spline curve S' is obtained by inserting a knot $t_a$ into S using Class 1, 2, 3, or 4 refinement. Denote by $r_1$ the largest multiplicity with which $t_a$ occurs in any blending function of S, and by $r_2$ the multiplicity of $t_a$ in the blending function(s) that are split during the refinement ($r_1$=0 means that $t_a$ does not occur in any blending function). If $r_1=r_2<4$, S' has linearly independent blending functions.

The above discussion regarding S-splines was directed to curves. Nevertheless, the above discussion has produced concepts that may be applied to analogous S-spline surfaces.

An S-spline surface is given by $$P(s, t) = \sum_{i=1}^{n} P_i B_i(s, t), \tag{8}$$

where $P_i=\omega_i(x_i, y_i, z_i, 1) \in \mathbb{P}^3$ is a control point with Cartesian coordinates $(x_i, y_i, z_i)$ and weight $\omega_i \in \mathbb{R}$. $B_i(s,t)$ is a bivariate blending function defined as follows:

$$B_i(s,t)=\beta_i B_{s_i}(s)B_{t_i}(t), \quad (9)$$

where $B_{s_i}(s)$ and $B_{t_i}(t)$ are univariate B-spline blending functions defined as in Eq. (4), with knot vectors $s_i=[s_{\sigma_i}^0, s_{\sigma_i}^1, s_{\sigma_i}^2, s_{\sigma_i}^3, s_{\sigma_i}^4]$ and $t_i=[t_{\tau_i}^0, t_{\tau_i}^1, t_{\tau_i}^2, t_{\tau_i}^3, t_{\tau_i}^4]$. The blending function weight $\beta_i$ is computed algorithmically, while the control point weight $\omega_i$ can be user specified. As in the curve case, knot vectors $s_i$ and $t_i$ are associated with knot index vectors $\sigma_i=[\sigma_i^0, \sigma_i^1, \sigma_i^2, \sigma_i^3, \sigma_i^4]$ and $\tau_i=[\tau_i^0, \tau_i^1, \tau_i^2, \tau_i^3, \tau_i^4]$, which are sequences of increasing integers. $s_i$ and $t_i$ are subsequences of global knot vectors $s=[s_0, s_1 \ldots, s_c]$ and $t=[t_0, t_1, \ldots, t_r]$ respectively.

As with T-splines, the control points $P_i$ are arranged topologically in a control mesh called a T-mesh. The pre-image of an S-spline surface can be diagrammed in the $(s,t)$ parameter plane using what is herein defined as a domain T-mesh.

Figure 8:
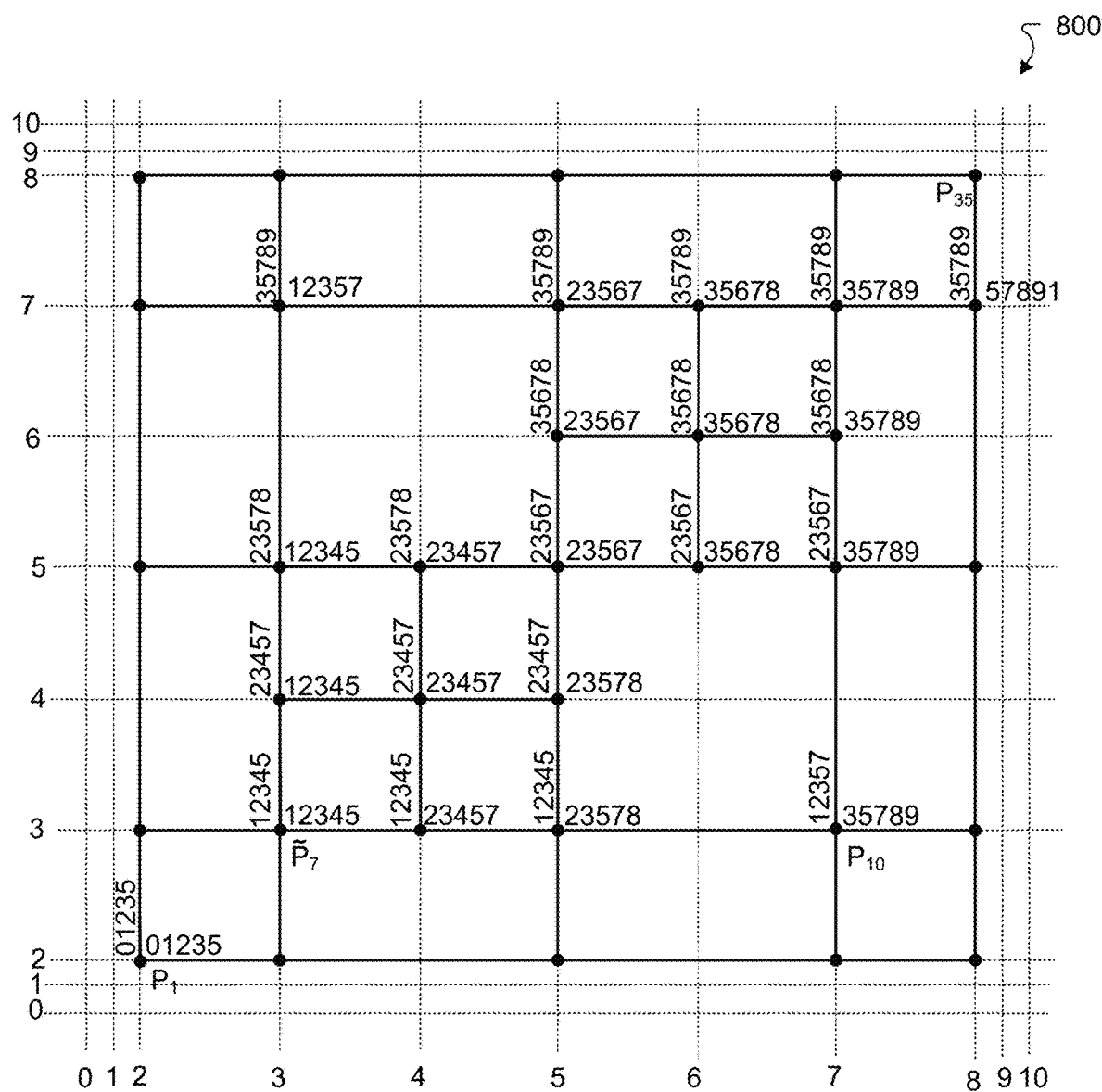
FIG. 8 is a diagram illustrating an example domain T-mesh.

FIG. 8 is a diagram illustrating an example domain T-mesh 800. FIG. 8 shows an illustration of the domain T-mesh 800 with $c=r=10$. The region $A=[2, c-2] \times [2, r-2]$ is highlighted in yellow. The domain T-mesh 800 is a rectangular decomposition of A. Vertices $P_i$, shown as black filled circles in FIG. 8, lie at rectangle corners. Each $P_i$ in the domain T-mesh corresponds to a control point $P_i$ in the control mesh.

In FIG. 8, the strings of five horizontal and vertical integers next to several control points are the index vectors $\sigma_i$ and $\tau_i$. For example, vertex $P_{10}$ has Cartesian coordinates (7,3) and blending function $B_i(s,t)=B_{[s_3,s_5,s_7,s_8,s_9]}(s)B_{[t_1,t_2,t_3,t_5,t_7]}(t)$. In the local knot vectors $s_i$ and $t_i$, $s_{\sigma_i}^2$ and $t_{\tau_i}^2$ are called the central knots, and $\alpha_i^2$ and $\tau_i^2$ are the central knot indices. In a T-spline, $s_i$ and $t_i$ are inferred from the domain T-mesh. In an S-spline surface, the only relationship that $s_i$ and $t_i$ have with the domain T-mesh is that $P_i=(\sigma_i^2, \tau_i^2)$. In a typical setting, prior to refinement for IGA, the values of the $s_i$ and $t_i$ are those for the initial NURBS or T-spline CAD model. The $s_i$ and $t_i$ values are then altered by the local refinement algorithm.

Figure 9A:
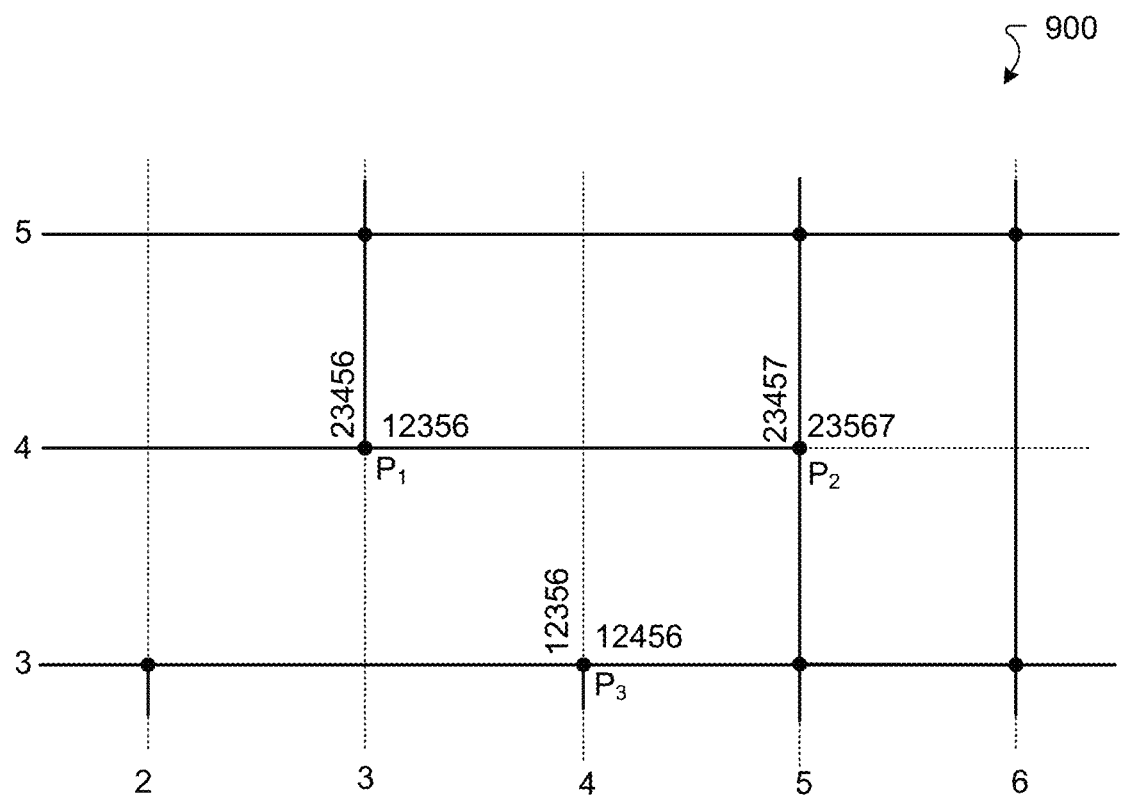
FIG. 9A is a diagram illustrating an example domain T-mesh into which a control point is to be inserted.

FIG. 9A is a diagram illustrating an example domain T-mesh 900 into which a control point is to be inserted. FIG. 9A shows a region of the domain T-mesh 900 into which a new control point $\tilde{P}_4$ with knot index coordinates (4,4) is to be inserted. There are several ways this can be done using Class 1 refinement.

Figure 9B:
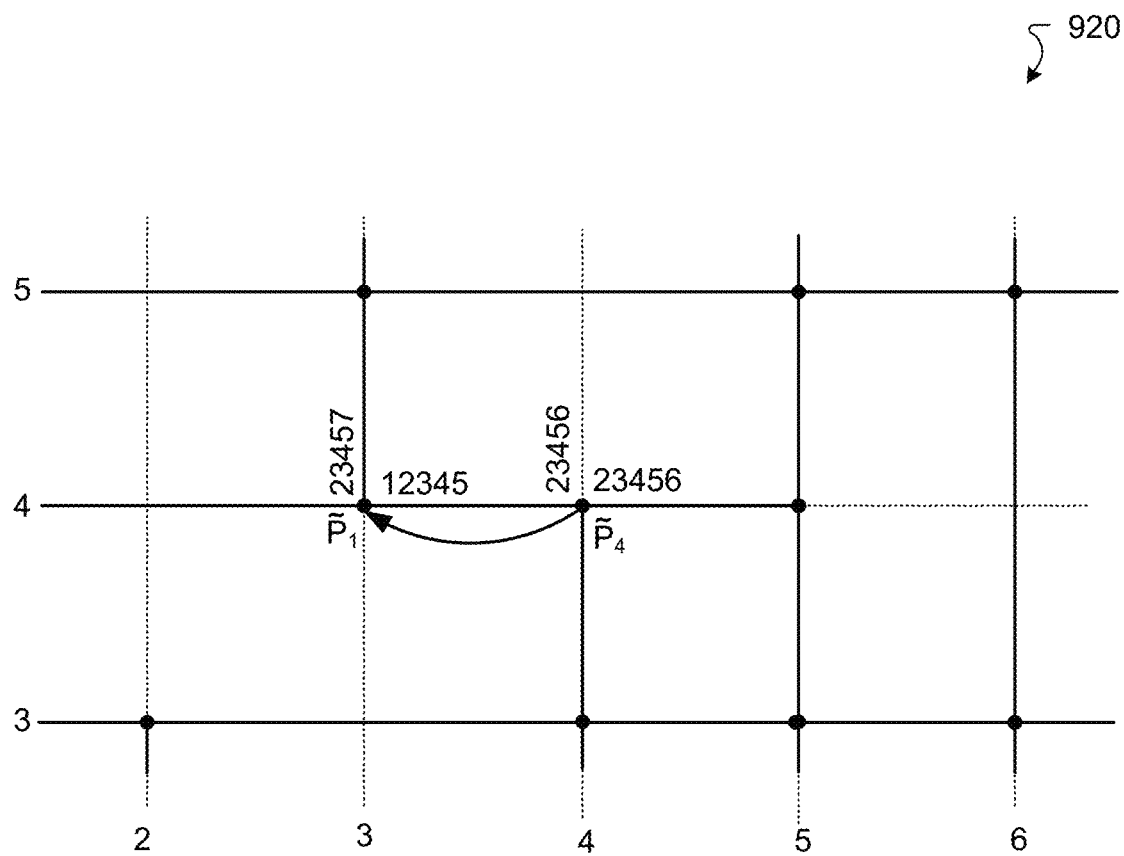
FIGS. 9B-9D are diagrams illustrating example domain T-meshes into which a control point is inserted using a Class 1 refinement.
Figure 9C:
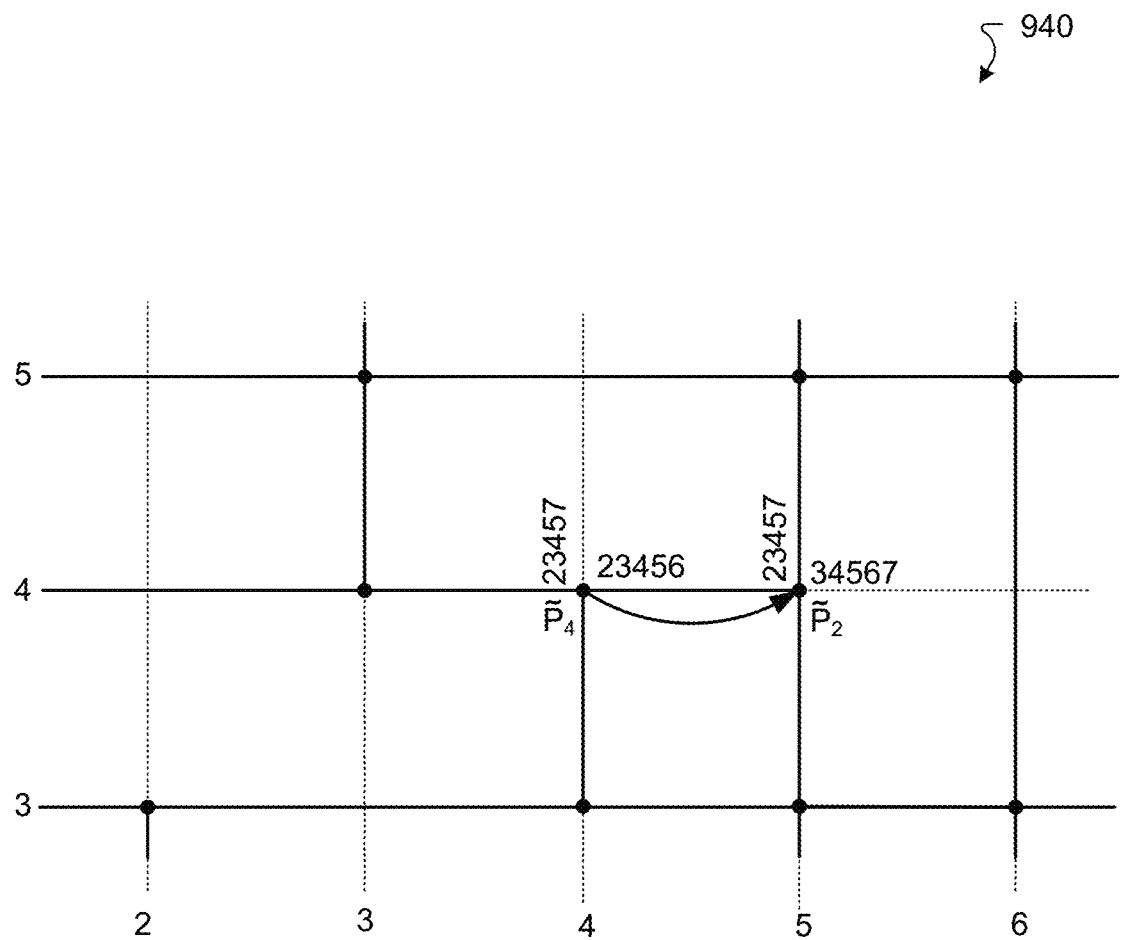
Figure 9D:
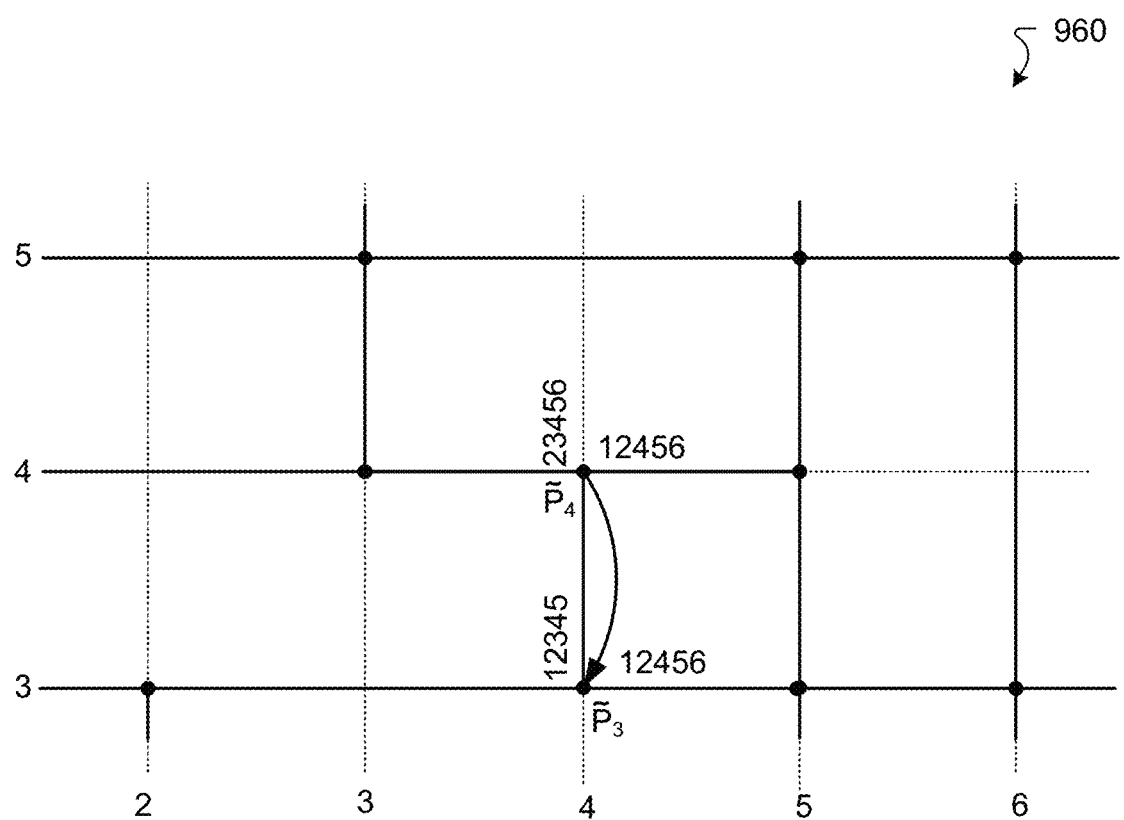

FIGS. 9B-9D are diagrams illustrating example domain T-meshes 920, 940, 960, respectively, into which a control point is inserted using a Class 1 refinement. FIG. 9B shows the result of splitting the blending function $B_1(s,t)=B_{[s_1,s_2,s_3,s_5,s_6]}(s)B_{[t_2,t_3,t_4,t_5,t_6]}(t)$ by inserting a knot $s_4$ into $B_{[s_1,s_2,s_3,s_5,s_6]}(s)$. To assure exact refinement (i.e., that the refined surface is identical to the initial surface), we require $$P_1 B_1(s, t) = P_1 \tilde{B}_1(s, t) + P_4 \tilde{B}_4(s, t), \text{ where} \quad (10)$$

$$\tilde{B}_1(s,t) = \beta_1 B_{[s_1,s_2,s_3,s_4,s_5]}(s)B_{[t_2,t_3,t_4,t_5,t_6]}(t) \text{ and}$$

$$\tilde{B}_4(s,t) = \beta_4 B_{[s_2,s_3,s_4,s_5,s_6]}(s)B_{[t_2,t_3,t_4,t_5,t_6]}(t).$$

From Eq. (5), $$B_{[s_1,s_2,s_3,s_5,s_6]}(s) =$$

$$\frac{s_4 - s_1}{s_5 - s_1} B_{[s_1,s_2,s_3,s_4,s_5]}(s) + \frac{s_6 - s_4}{s_6 - s_2} B_{[s_2,s_3,s_4,s_5,s_6]}(s),$$

so Eq. (10) is satisfied if $\tilde{P}_1 = \tilde{P}_4 = P_1$, $$\beta_1 = \frac{s_4 - s_1}{s_5 - s_1}, \text{ and } \beta_4 = \frac{s_6 - s_4}{s_6 - s_2}.$$

FIGS. 9C and 9D show two alternatives for adding a control point at (4,4) via Class 1 refinement. The arc in each of FIGS. 9B-9D originate at the "child" control point (the new control point) and points at their "parent" control point, or the one whose blending function was split. For exact Class 1 refinement, both child and parent should be positioned at the original coordinates of the parent.

It is noted that the examples herein assume cubic B-spline basis functions are used. Nevertheless, the improved techniques described herein do not require that the B-spline basis functions are cubic. In some implementations, the B-spline basis functions are of an odd degree. In some implementations, the B-spline basis functions are of an even degree.

Figure 10A:
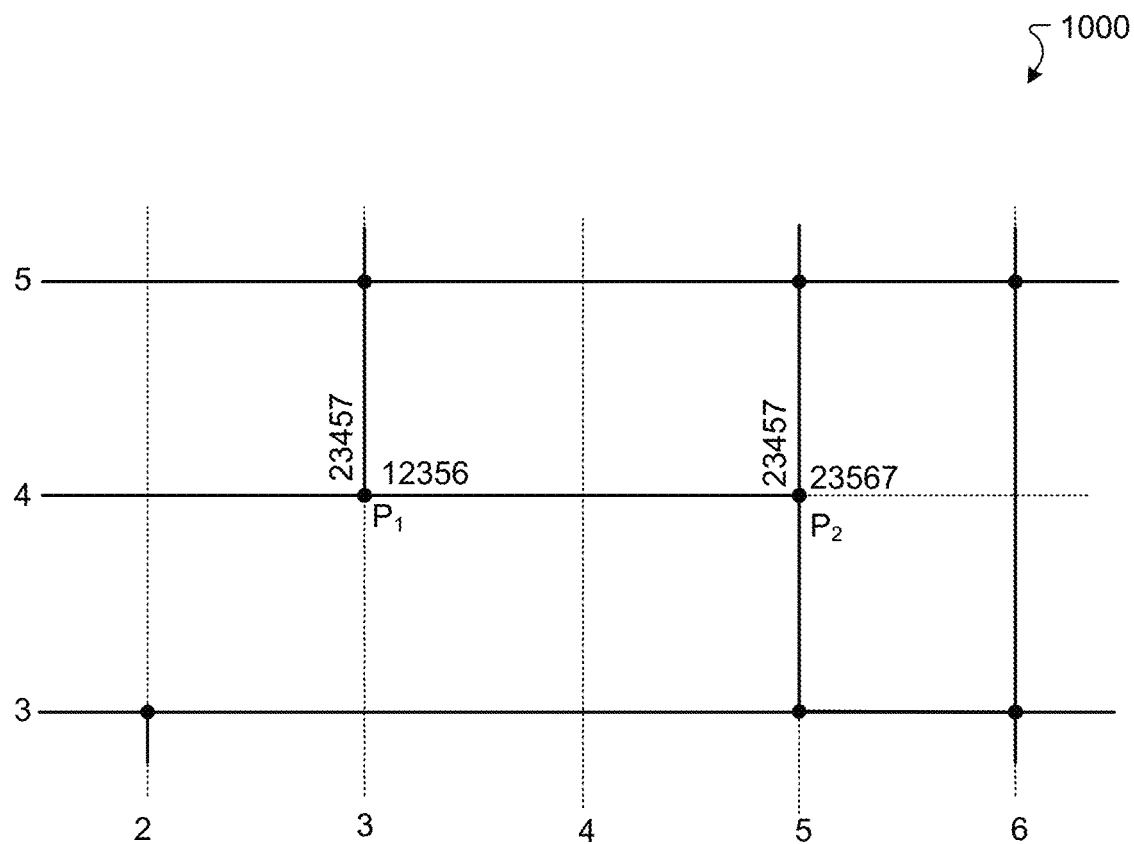
FIG. 10A is a diagram illustrating another example domain T-mesh into which a control point is to be inserted.

FIG. 10A is a diagram illustrating another example domain T-mesh 1000 into which a control point is to be inserted. In FIG. 9A, $B_1(s,t)$ and $B_2(s,t)$ are not refinement compatible because $t_i \neq t_j$, but they are refinement compatible in FIG. 10A. Class 2 refinement can be performed on two blending functions $B_i(s,t)=\beta_i B_{s_i}(s)B_{t_i}(t)$ and $B_j(s,t)=\beta_j B_{s_j}(s)B_{t_j}(t)$ that are refinement compatible. This means either that $t_i$ and $t_j$ have four knots in common, and $s_i=s_j$; or that $s_i$ and $s_j$ have four knots in common, and $t_i=t_j$.

Inserting the knot $s_4$ into $B_{s_1}(s)$ and $B_{s_2}(s)$ and collecting terms, we achieve exact refinement by setting $\tilde{P}_1 = P_1$, $\tilde{P}_2 = P_2$, $$\tilde{P}_4 = \frac{(s_6 - s_4)P_1 + (s_4 - s_2)P_2}{s_6 - s_2}, \beta_1 = \frac{s_4 - s_1}{s_5 - s_1}, \beta_2 = 1, \beta_4 = \frac{s_7 - s_4}{s_7 - s_3}.$$

Figure 10B:
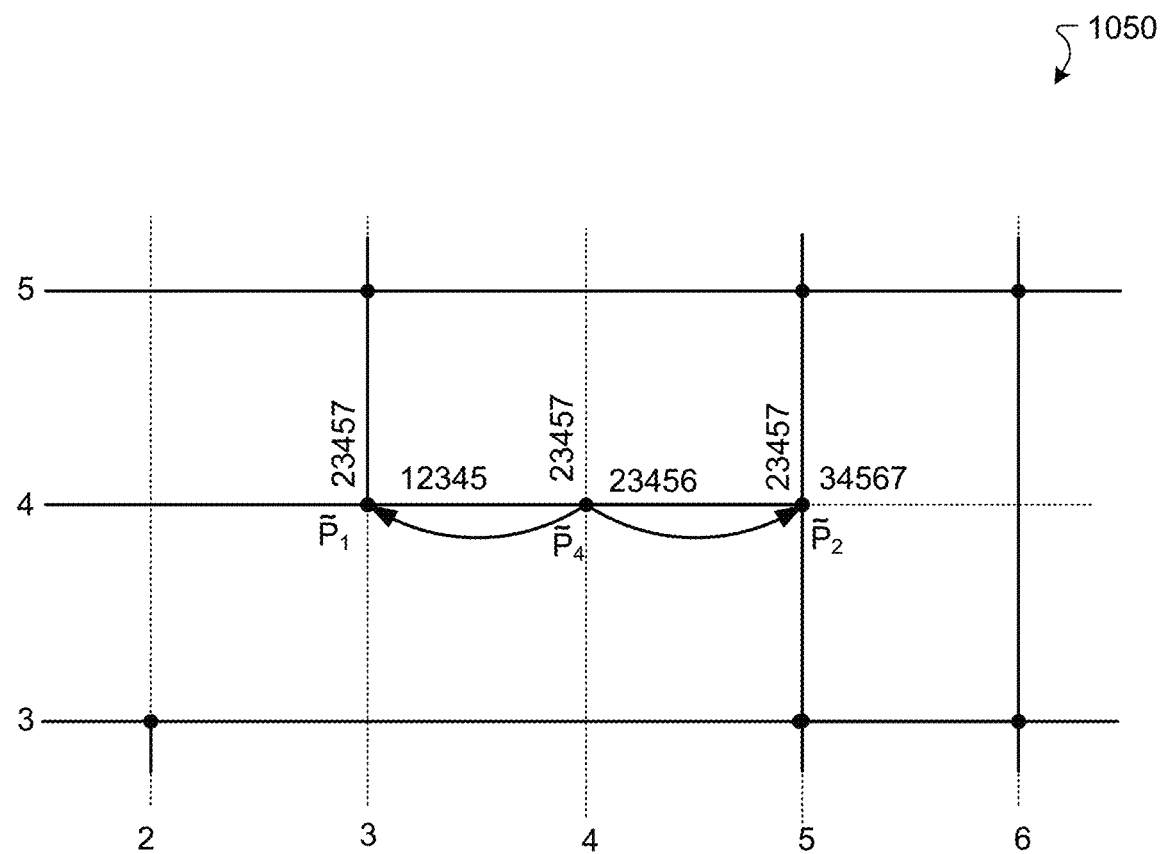
FIG. 10B is a diagram illustrating the example domain T-mesh of FIG. 10A into which a control point is inserted using a Class 2 refinement.

FIG. 10B is a diagram illustrating the example domain T-mesh 1050 of FIG. 10A into which a control point is inserted using a Class 2 refinement. As in FIGS. 9A-9D, the arcs in FIG. 10B indicate which blending functions were split to create the new blending function. If there are three or four refinement-compatible blending functions, it is possible to perform Class 3 or 4 refinement.

As illustrated in FIGS. 5A-C, refinement for IGA applications typically consists of recursively splitting faces into fourths. This is easily accomplished using Class 1 refinements.

Figure 11A:
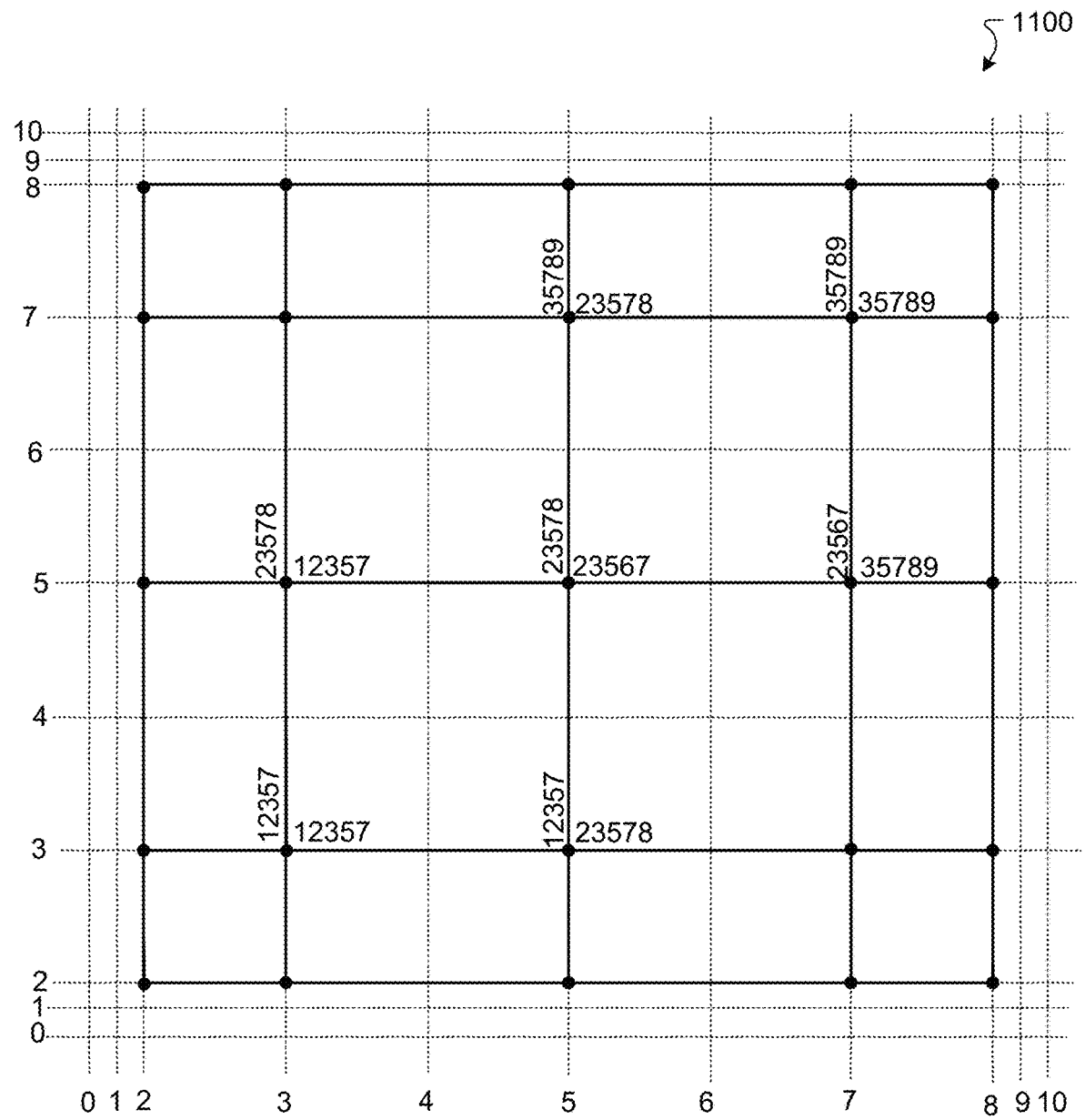
FIG. 11A is a diagram illustrating another example domain T-mesh into which a control point is to be inserted such that a face of the domain T-mesh is split into fourths.
Figure 11B:
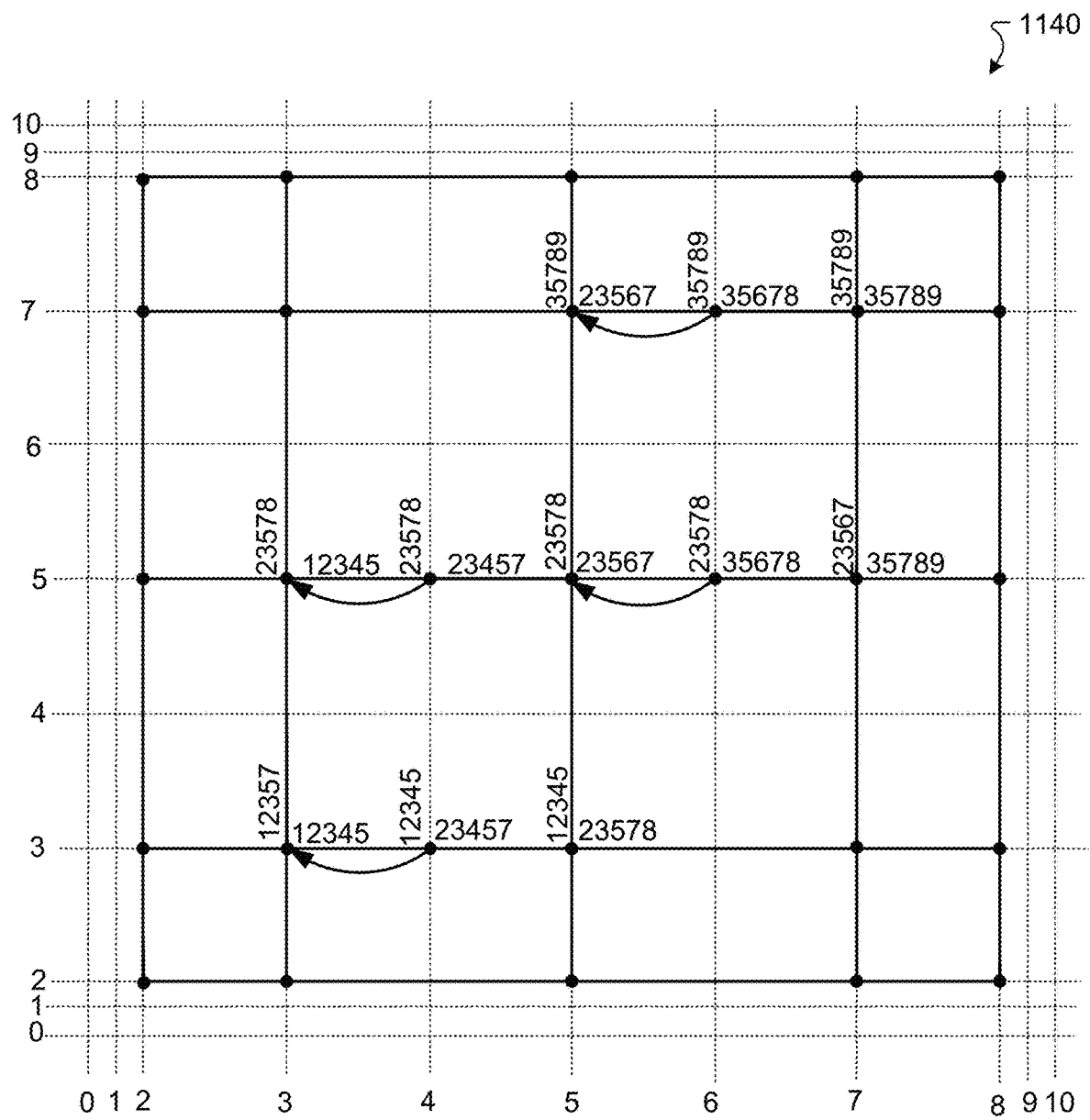
FIG. 11B is a diagram illustrating the example domain T-mesh of FIG. 11A after a first insertion of a control point using a Class 1 refinement.
Figure 11C:
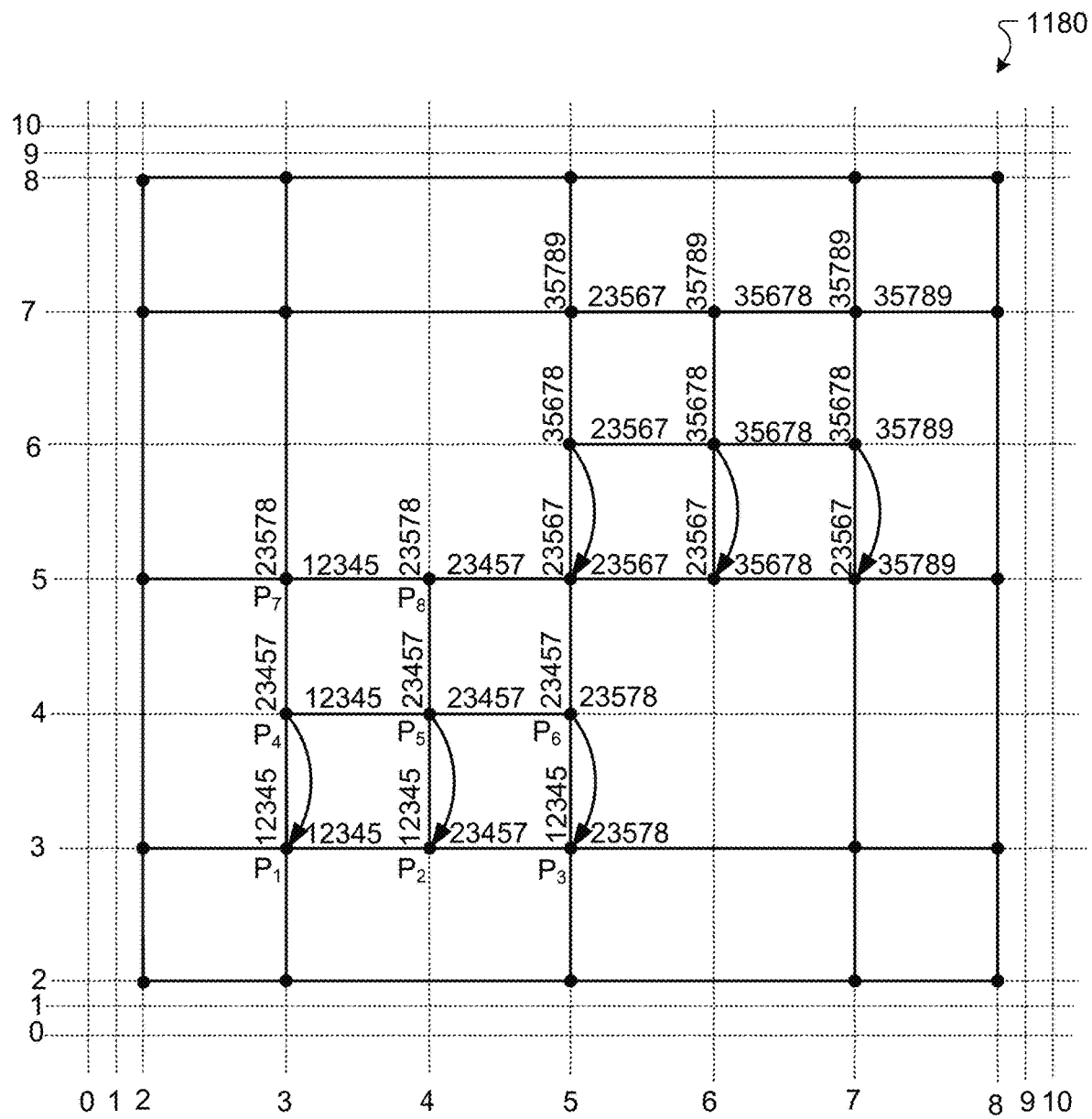
FIG. 11C is a diagram illustrating the example domain T-mesh of FIG. 11A after a second insertion of a control point using a Class 1 refinement.

FIG. 11A is a diagram illustrating another example domain T-mesh 1100 into which a control point is to be inserted such that a face of the domain T-mesh is split into fourths. FIG. 8.a shows a B-spline control grid and knot index vectors for seven blending functions. FIG. 11B is a diagram illustrating the example domain T-mesh of FIG. 11A after a first insertion of a control point using a Class 1 refinement. In FIG. 11B, four new control points were created using Class 1 refinements. FIG. 11C is a diagram illustrating the example domain T-mesh of FIG. 11A after a second insertion of a control point using a Class 1 refinement. In FIG. 11C, six additional control points were created. For exact refinement, i.e., the geometry is not altered, none of the original control points in FIG. 11C are moved, and $P_2=P_4=P_5=P_1$, $P_6=P_3$, $P_8=P_7$, etc.

Figure 12A:
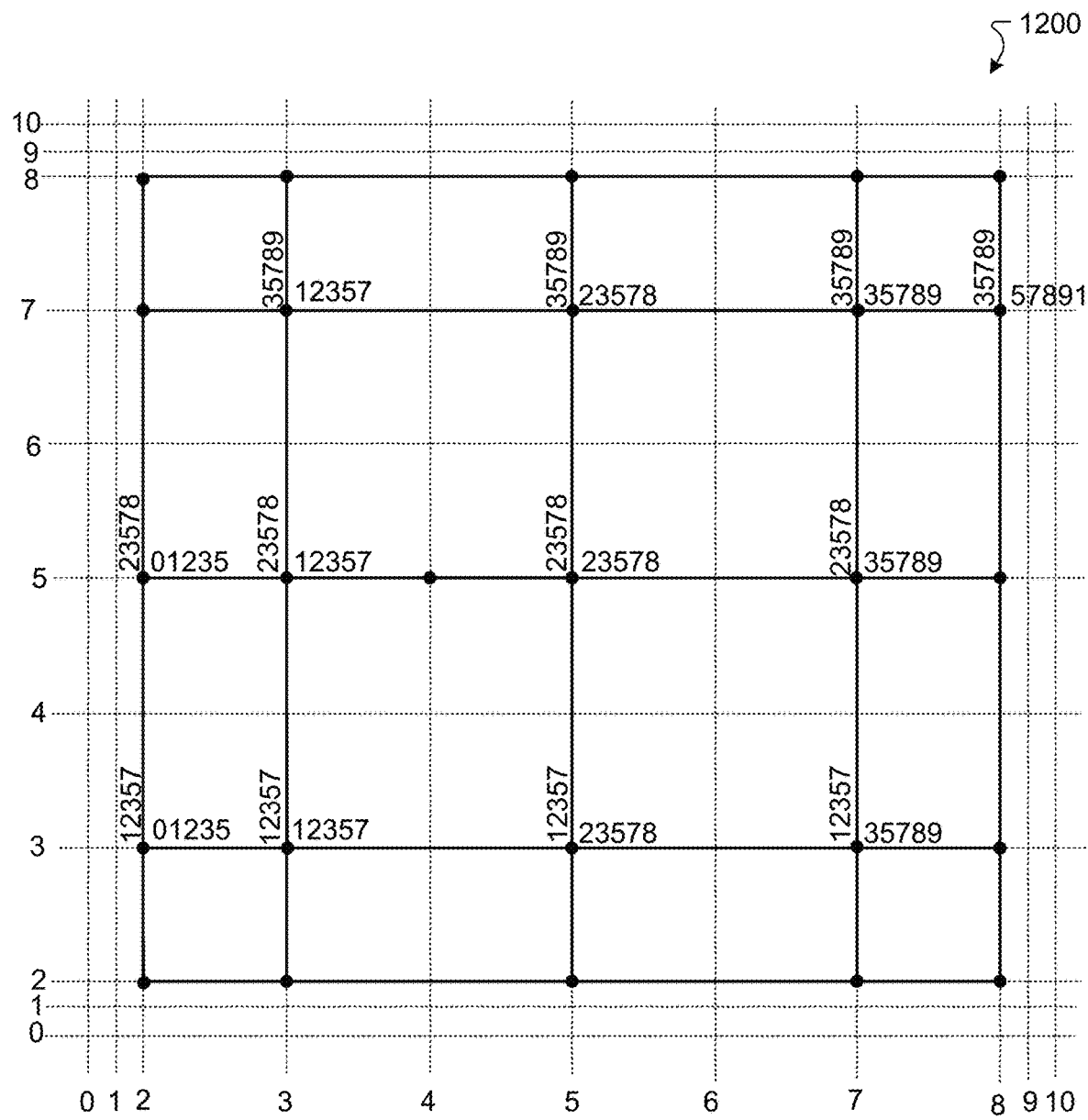
FIG. 12A is a diagram illustrating another example domain T-mesh into which a control point is to be inserted such that a face of the domain T-mesh is split into fourths.
Figure 12B:
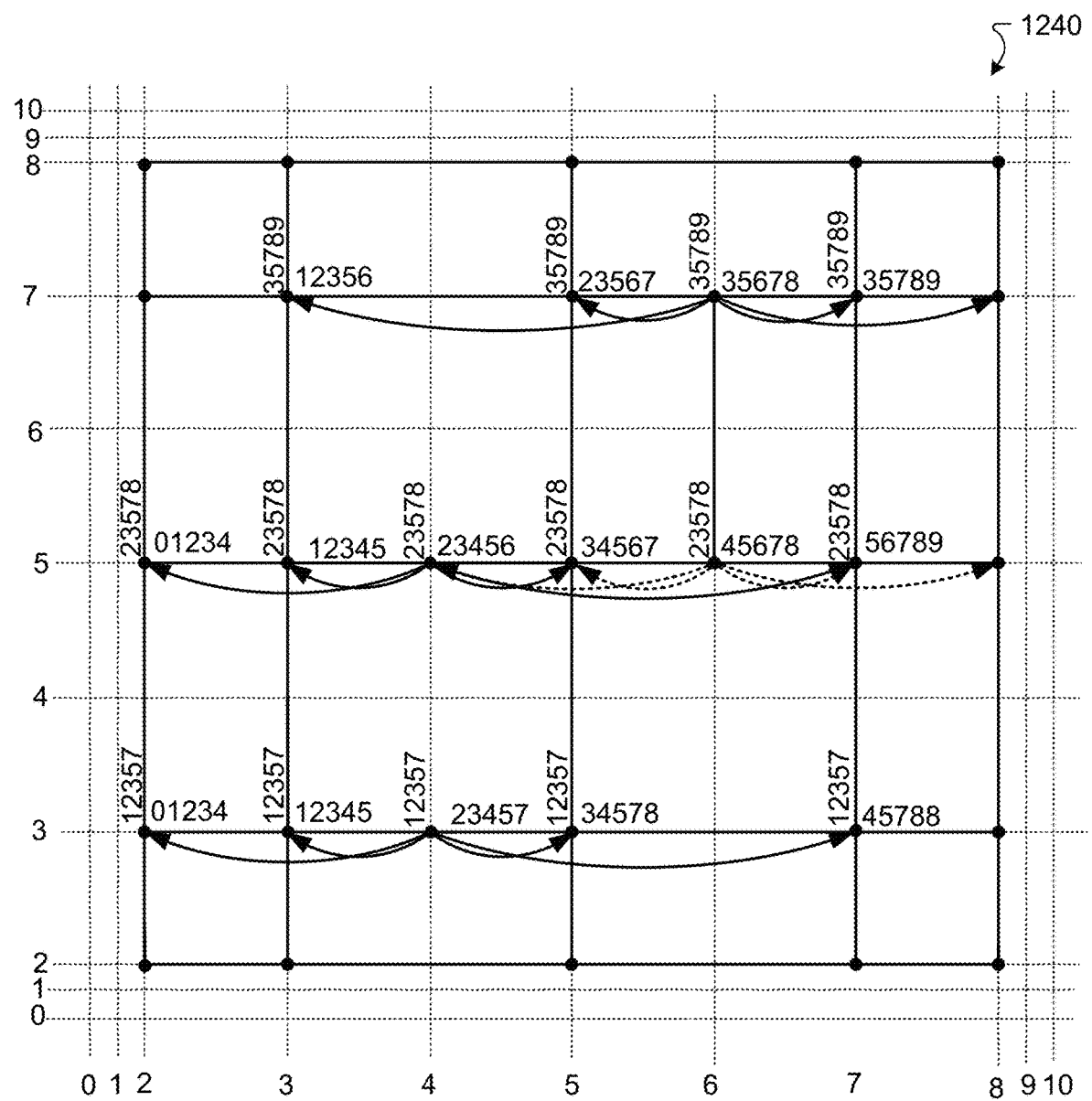
FIG. 12B is a diagram illustrating the example domain T-mesh of FIG. 12A after insertion of control points using four Class 4 refinements.
Figure 12C:
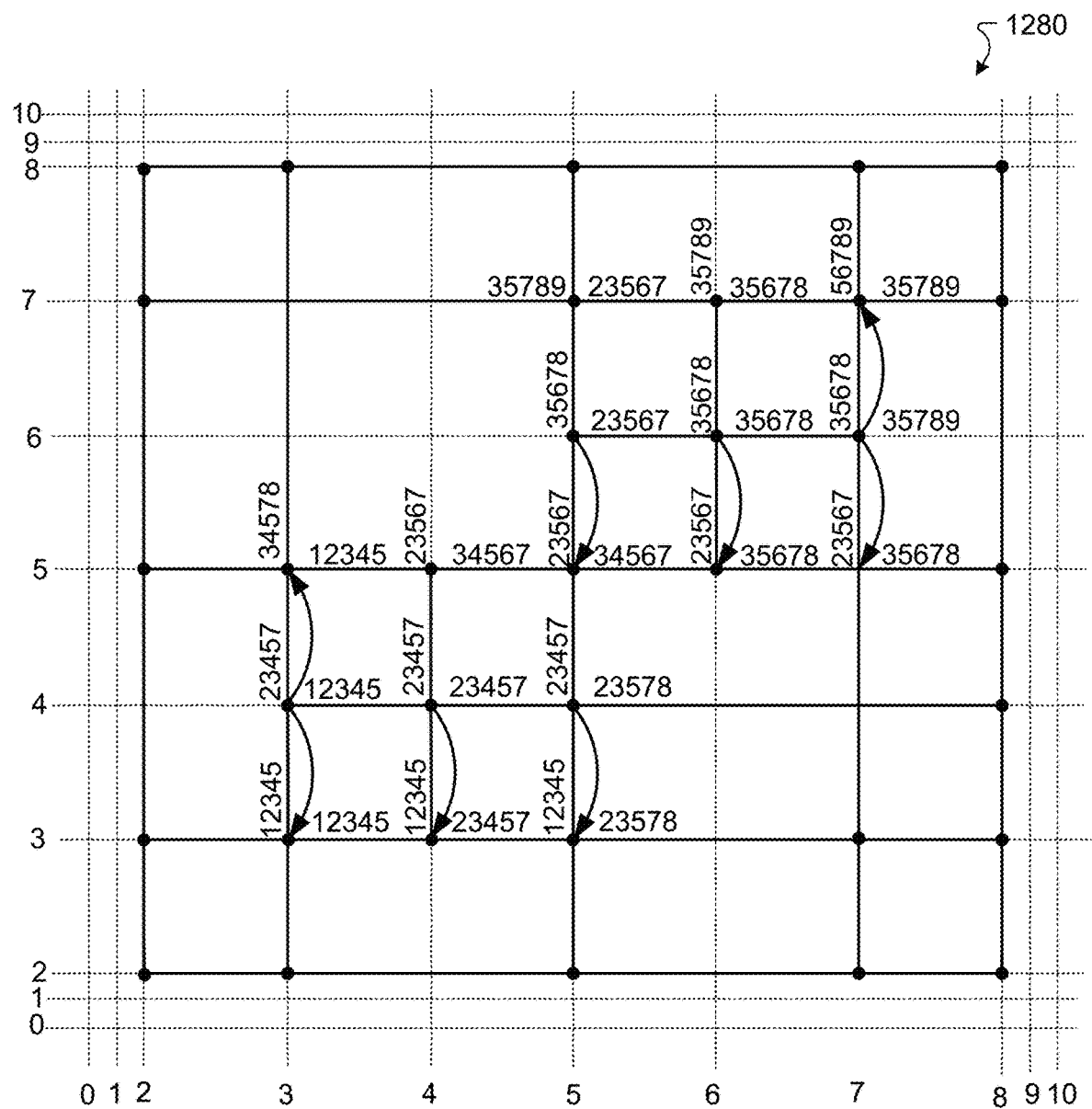
FIG. 12C is a diagram illustrating the example domain T-mesh of FIG. 12A after a second insertion of a control point using two Class 2 refinements and four Class 1 refinements.

An alternative refinement strategy is to insert each new control point using the maximum class possible. FIG. 12A is a diagram illustrating another example domain T-mesh 1200 into which a control point is to be inserted such that a face of the domain T-mesh is split into fourths. FIG. 12B is a diagram illustrating the example domain T-mesh of FIG. 12A after insertion of control points using four Class 4 refinements. FIG. 12C is a diagram illustrating the example domain T-mesh of FIG. 12A after a second insertion of a control point using two Class 2 refinements and four Class 1 refinements. In FIG. 12B, four new control points are inserted using Class 4 refinements. In FIG. 12C, two control points are inserted using Class 2 refinement, and four are inserted using Class 1.

Figure 13A:
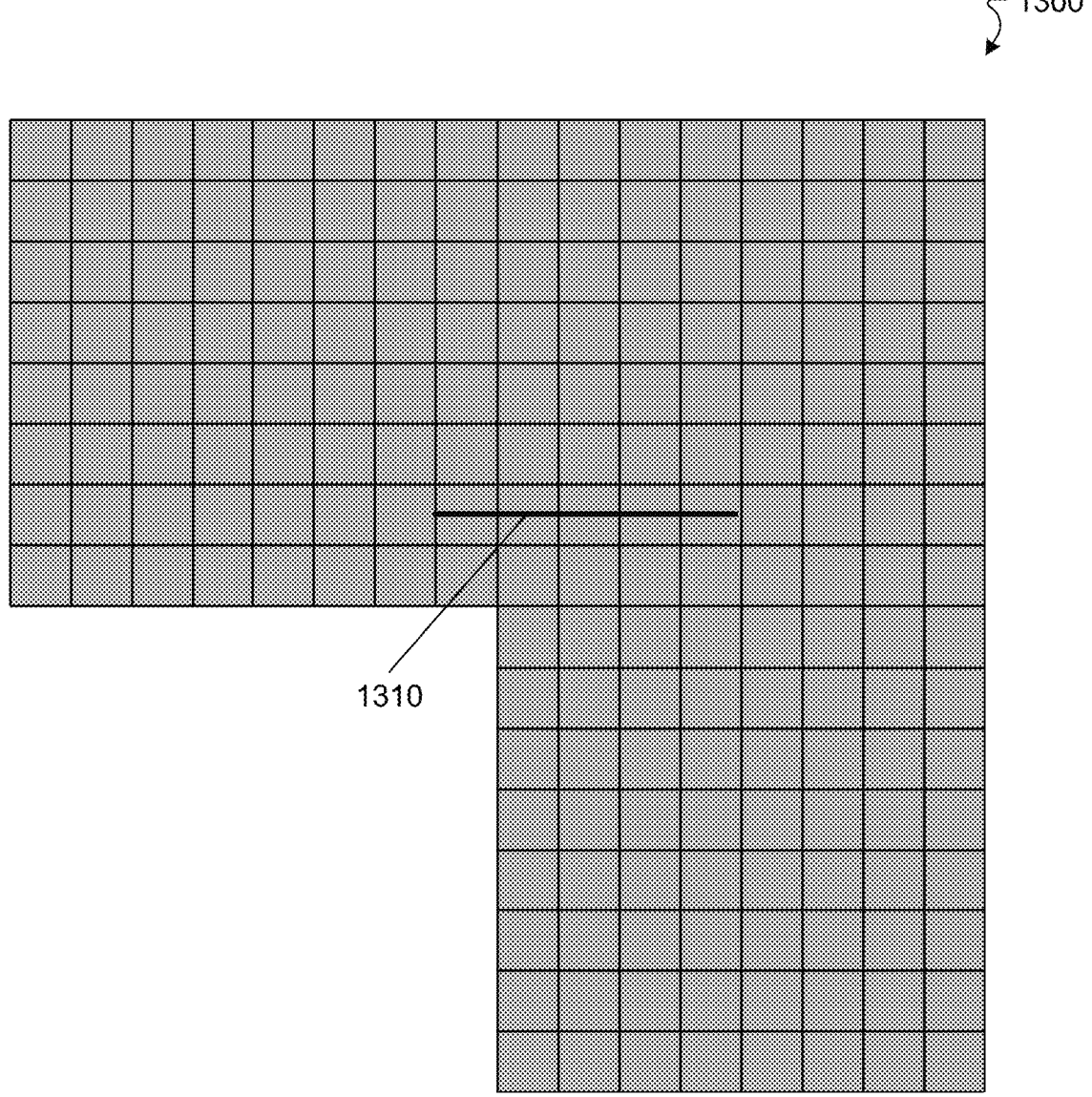
FIG. 13A is a diagram illustrating another example domain T-mesh.

FIG. 13A is a diagram illustrating another example domain T-mesh 1300. As illustrated in FIGS. 5A-C and 11A-C, the pattern of refinement typically used in IGA is to split faces into fourths. The question of whether the resulting S-splines are linearly independent is facilitated if all new control points along a new knot line 1310 are inserted simultaneously, such as the six new control points in FIG. 13A. The discussion herein focuses on new rows but applies to new columns as well.

Figure 13B:
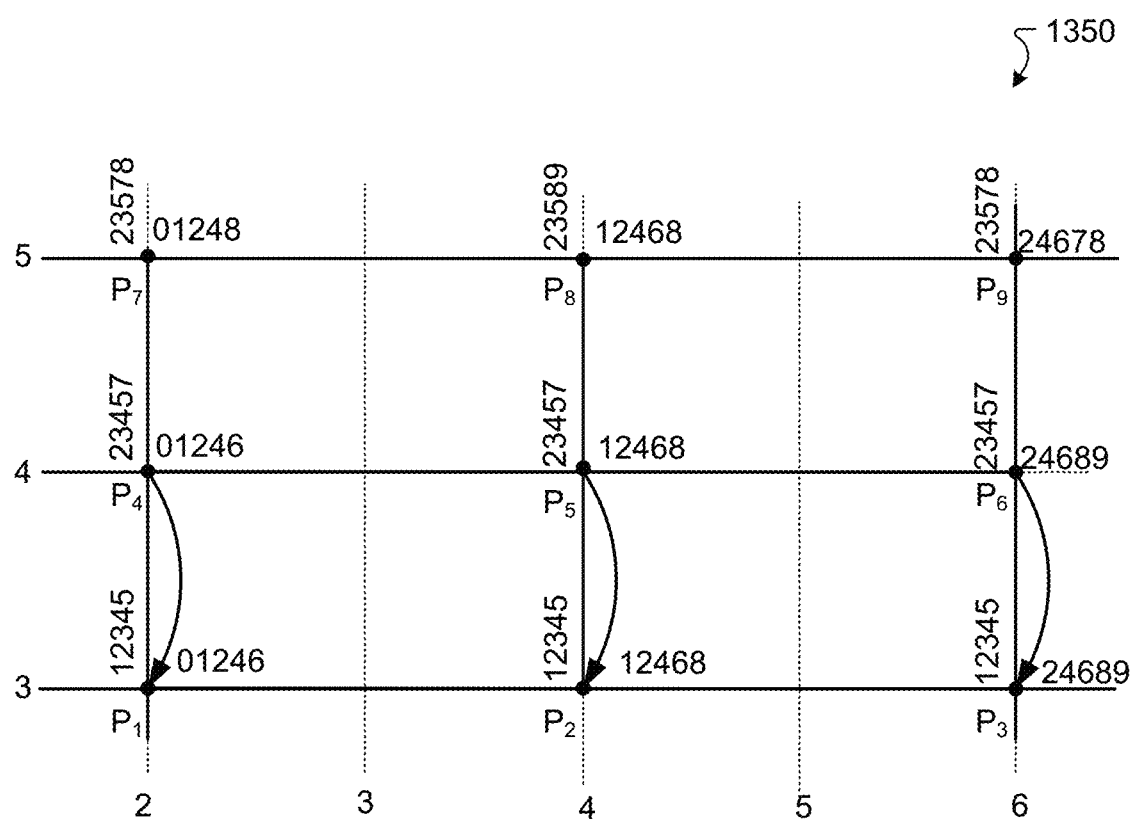
FIG. 13B is a diagram illustrating an insertion of an additional row of control points using Class 1 refinements.

FIG. 13B is a diagram illustrating an insertion 1350 of an additional row of control points using Class 1 refinements. The discussion of linear independence refers to FIG. 13B.

Row Linear Independence.

Expanding the equation of a blending function Eq. (9), $$B_i(s, t) = \beta_i B_{s_i}(s) B_{t_i}(t) = \beta_i B_{[s_{\sigma_i^0}, s_{\sigma_i^1}, s_{\sigma_i^2}, s_{\sigma_i^3}, s_{\sigma_i^4}]}(s) B_{[t_{\tau_i^0}, t_{\tau_i^1}, t_{\tau_i^2}, t_{\tau_i^3}, t_{\tau_i^4}]}(t),$$

each $B_i(s,t)$ associated with a row with knot index k have central knot index $\tau_i^2=k$. Define $B_k^R=\{B_{s_i}(s) | \tau_i^2=\gamma\}$ for all rows. Likewise, for all columns, define $B_k^C=\{B_{t_i}(t) | \sigma_i^2=k\}$. An S-spline is said to be row linearly independent if the blending functions in each set $B_k^R$ and $B_k^C$ are linearly independent.

Any T-spline (or NURBS) surface is row linearly independent, because the rules for inferring blending functions from a T-mesh yield blending functions $B_{s_i}(s)$ along any row of control points (or, $B_{t_i}(t)$ along any column of control points) that are equivalent to blending functions for a NURBS curve.

Interestingly, an S-spline surface that has linearly independent blending functions is not necessarily row linearly independent. But, if an initial surface is a NURBS or T-Spline surface and Row Insertion operations are repeatedly performed, the resulting S-spline surface will be both row linearly independent and have linearly independent blending functions, as Lemma 2 and Theorem 1 show herein.

Row Insertion is the operation of inserting a row of new control points, as in FIG. 10.a, with the following conditions:
1. $r_2 \geq r_1$, where $r_1$ the largest multiplicity with which the new knot ($t_4$ in FIG. 13B) occurs in any local knot vectors $t_i$, and $r_2$ is the multiplicity of that knot in local knot vectors $t_i$ of the blending functions that are split during the refinement ($r_1=0$ means that $t_a$ does not occur in any blending function).
2. Referring to FIG. 13B, the local knot vectors $s_i$ for $P_4$, $P_5$, and $P_6$ can either be the same as those for $P_1$, $P_2$, and $P_3$, respectively, or for those of $P_7$, $P_8$, and $P_9$, respectively. In the example in FIG. 13B, this condition is met by doing Class 1 refinements on Row 3. It could also have been met by doing Class 1 refinements on Row 5. If blending functions on Row 3 are refinement compatible with blending functions on Row 5, the condition could also be satisfied by performing refinements of Class ≥2.

Lemma 2 If Row Insertion is performed on an S-spline P(s,t) that is row linearly independent, the resulting S-spline P(s,t) is row linearly independent.

Theorem 1 If Row Insertion is performed on an S-spline P(s,t) with linearly independent blending functions and that is also row linearly independent, the blending functions of the resulting S-spline surface P(s,t) are linearly independent.

Figure 14A:
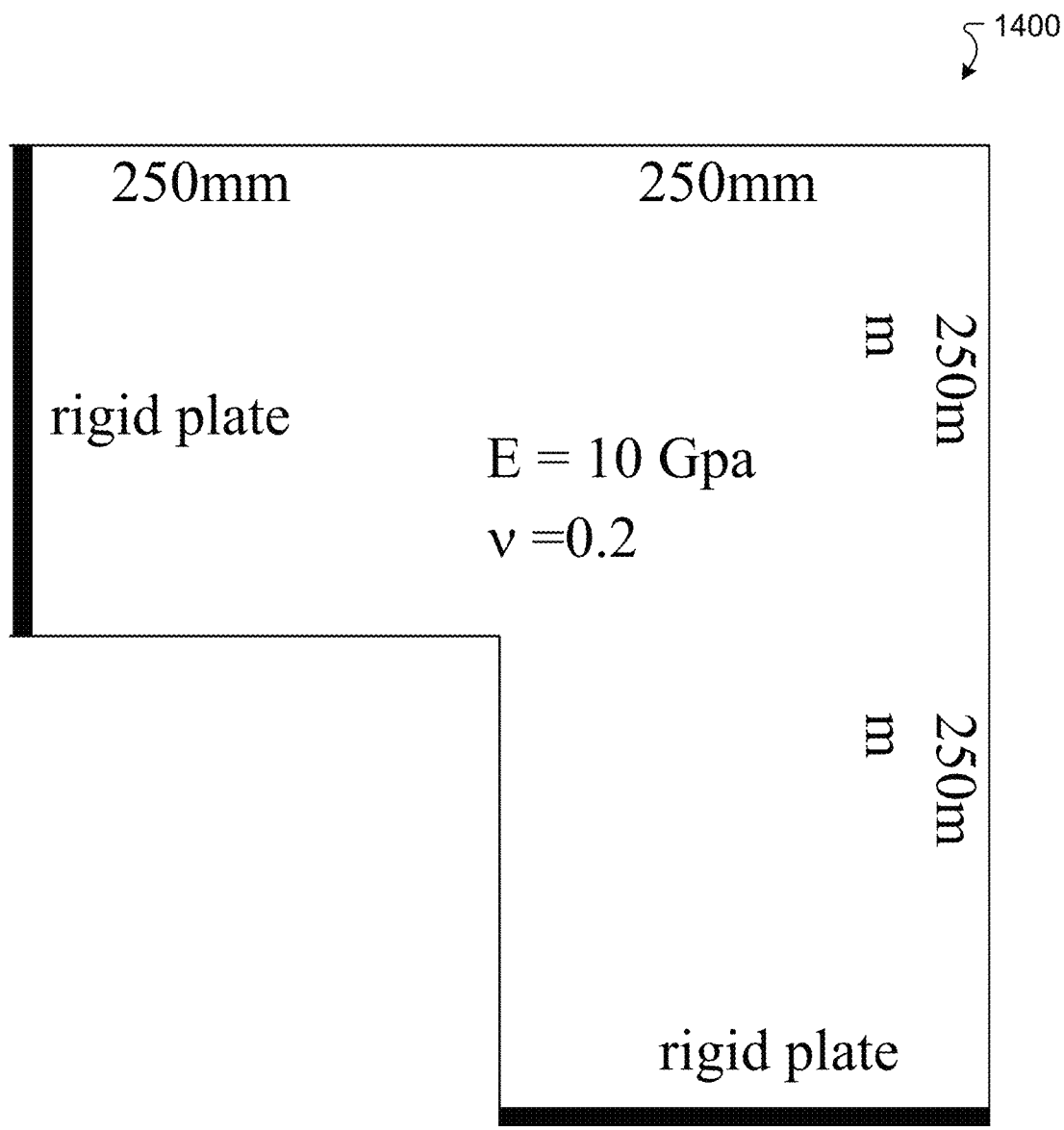
FIG. 14A is a diagram illustrating an implicit gradient damage problem over an L-shaped domain, e.g., that shown in FIG. 13A.

FIG. 14A is a diagram illustrating an implicit gradient damage problem 1400 over an L-shaped domain, e.g., that shown in FIG. 13A. Continuum damage models are widely used for the simulation of diffuse fracture processes. Among the gradient damage formulations, the implicit gradient enhancement is considered the most successful. This issue is improved using isogeometric finite elements to overcome the problems associated with the use of mixed formulations and meshless methods for gradient damage formulations. Here, the L-shaped specimen shown in FIG. 14A is considered using gradient damage formulations. In this example, Young's modulus is 10 GPa and Poisson's ratio is 0.2. The left and bottom edges are modeled as rigid plates. Pinned roller supports are placed at the left and bottom ends of the bottom and left rigid plates respectively. This ensures that only a rigid rotation is allowed at the support. The supports are then displaced symmetrically in the x and y directions as shown. The problem configuration and loading ensures that the damage field starts developing at the concave corner and migrates at a forty-five degree angle towards the upper right corner of the domain. Increasing resolution only in the vicinity of the damage field is accomplished using S-spline local refinement.

The efficiency of the conventional and improved refinement techniques is compared in terms of the number of control points. At each refinement level, the neighboring five faces are split along the diagonal edges into four faces. Additional T-mesh topology is then added by the refinement algorithms to ensure nestedness in the resulting refined space.

Figure 14B:
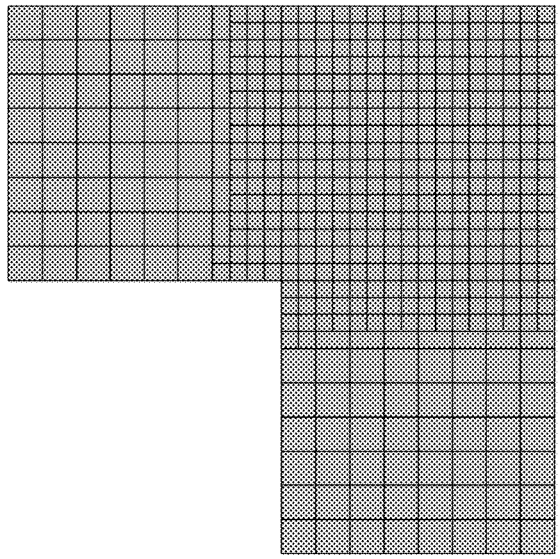
FIGS. 14B-14D are diagrams illustrating a sequence of refined meshes using conventional B-spline refinements.
Figure 14C:
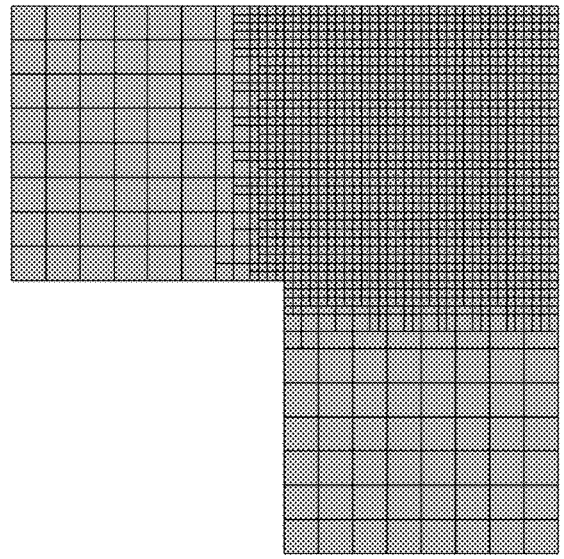
Figure 14D:
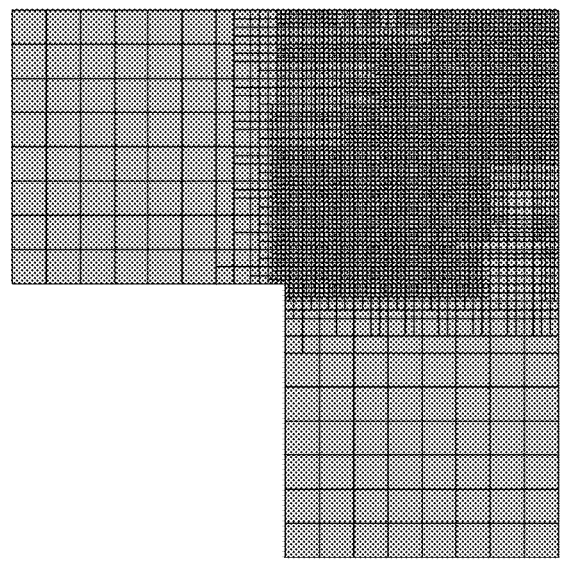
Figure 14E:
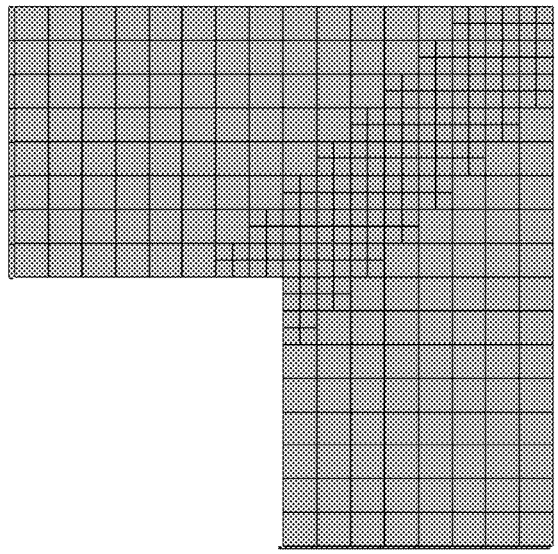
FIGS. 14E-14G are diagrams illustrating a sequence of refined meshes using T-spline refinements.
Figure 14F:
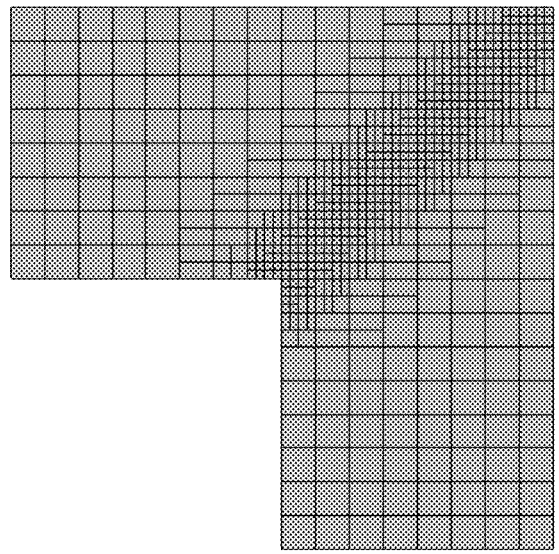
Figure 14G:
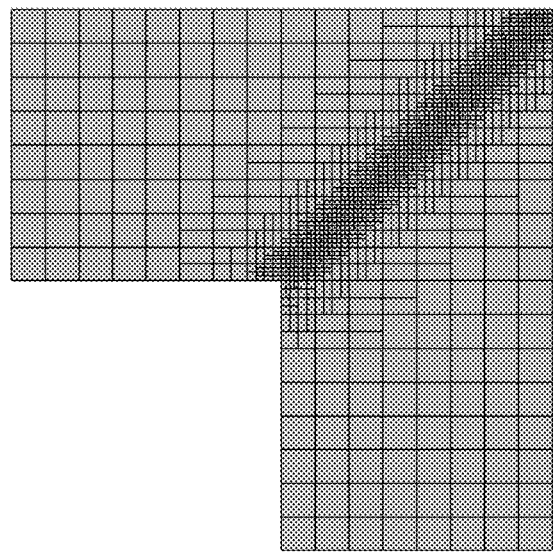
Figure 14H:
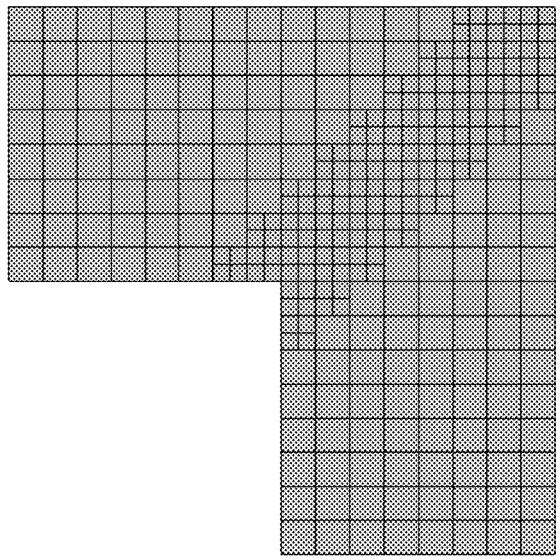
FIGS. 14H-14J are diagrams illustrating a sequence of refined meshes using S-spline refinements according to the improved techniques within the electronic environment illustrated in FIG. 1.
Figure 14I:
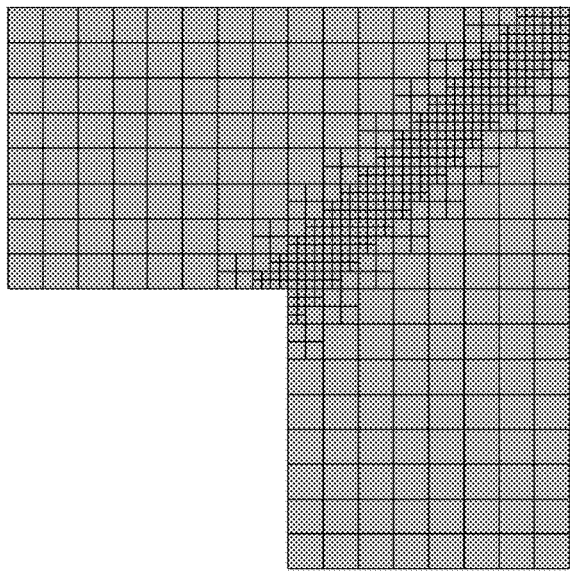
Figure 14J:
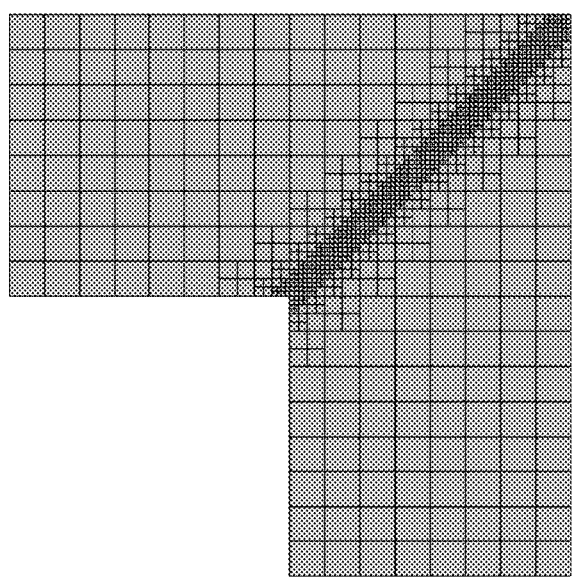

FIGS. 14B-14D are diagrams illustrating a sequence of refined meshes using T-spline refinements analogous to those shown in FIG. 3B, with 587 vertices, 1537 vertices, and 4551 vertices, respectively. FIGS. 14E-14G are diagrams illustrating a sequence of refined meshes using T-spline refinements, with 365 vertices, 685 vertices, and 1425 vertices, respectively. FIGS. 14H-14J are diagrams illustrating a sequence of refined meshes using S-spline refinements according to the improved techniques within the electronic environment illustrated in FIG. 1, with 336 vertices, 584 vertices, and 1194 vertices, respectively. It is noted that the new algorithm converges to an optimal refinement for the requested refinement pattern.

Figure 14K:
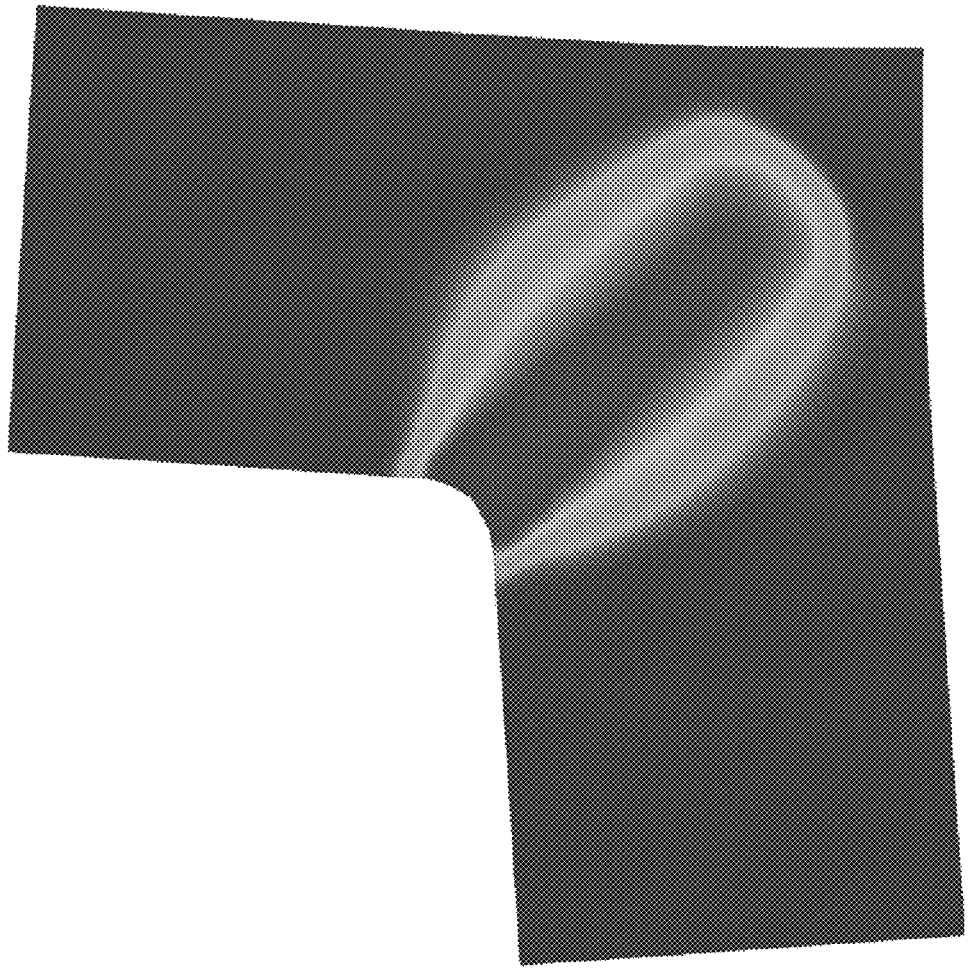
FIG. 14K is a diagram illustrating a contour plot of the sixth-order damage field obtained using the improved S-spline refinement techniques within the electronic environment illustrated in FIG. 1.

FIG. 14K is a diagram illustrating a contour plot of the sixth-order damage field obtained using the improved S-spline refinement techniques within the electronic environment illustrated in FIG. 1.

The components (e.g., modules, processing units 124) of the computer 120 can be configured to operate based on one or more platforms (e.g., one or more similar or different platforms) that can include one or more types of hardware, software, firmware, operating systems, runtime libraries, and/or so forth. In some implementations, the components of the computer 120 can be configured to operate within a cluster of devices (e.g., a server farm). In such an implementation, the functionality and processing of the components of the computer 120 can be distributed to several devices of the cluster of devices.

The components of the computer 120 can be, or can include, any type of hardware and/or software configured to process attributes. In some implementations, one or more portions of the components shown in the components of the computer 120 in FIG. 1 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the computer 120 can be, or can include, a software module configured for execution by at least one processor (not shown). In some implementations, the functionality of the components can be included in different modules and/or different components than those shown in FIG. 1.

In some embodiments, one or more of the components of the computer 120 can be, or can include, processors configured to process instructions stored in a memory. For example, a spatial mesh data acquisition manager 130 (and/or a portion thereof), a eigen polyhedron manager 140 (and/or a portion thereof), a refinement matrix manager 150 (and/or a portion thereof), and a refinement operation manager 160 (and/or a portion thereof can be a combination of a processor and a memory configured to execute instructions related to a process to implement one or more functions.

In some implementations, the memory 126 can be any type of memory such as a random-access memory, a disk drive memory, flash memory, and/or so forth. In some implementations, the memory 126 can be implemented as more than one memory component (e.g., more than one RAM component or disk drive memory) associated with the components of the computer 120. In some implementations, the memory 126 can be a database memory. In some implementations, the memory 126 can be, or can include, a non-local memory. For example, the memory 126 can be, or can include, a memory shared by multiple devices (not shown). In some implementations, the memory 126 can be associated with a server device (not shown) within a network and configured to serve the components of the editing computer 120. As illustrated in FIG. 1, the memory 126 is configured to store various data, including spatial mesh data 132, eigen polyhedron data 142, refinement matrix data 152, and refined mesh data 162.

In some implementations, the network interface 122 includes, for example, Ethernet adaptors, Token Ring adaptors, and the like, for converting electronic and/or optical signals received from a network to electronic form for use by the editing computer 120. The set of processing units 124 include one or more processing chips and/or assemblies. The memory 126 includes both volatile memory (e.g., RAM) and non-volatile memory, such as one or more ROMs, disk drives, solid state drives, and the like.

S-spline surfaces show promise for use in IGA. A major advantage that S-splines have over T-splines is that exact local refinement can be performed without propagating unwanted control points. Furthermore, the refinement algorithm for S-splines is significantly simpler to understand and implement than for T-splines.

Future IGA-related research is needed to study the conditioning of the matrices, extend S-splines to handle extraordinary points, and run performance tests against competing local refinement strategies such as AS-T-splines and hierarchical B-splines. Trivariate S-splines should have the same minimal-degree-of-freedom advantages for volumetric IGA as S-spline surfaces have for shell elements.

S-splines also show promise for use in CAD. An ongoing complaint that users of T-splines have expressed is the extra control points that usually arise when doing T-splines local refinement. Designers often find these extra control points confusing. Since S-splines avoid this problem, they might be attractive to designers in the CAD industry. A drawback of Class 1 refinement is that it results in two control points having the same Cartesian coordinates and with smaller weights. It remains to be seen if a friendly user interface can mitigate this problem.

The use of S-splines for shape optimization problems is an obvious application that should also be explored. Since control points are manipulated algorithmically in shape optimization, a friendly user interface is not needed.

Methods discussed above may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

A number of embodiments have been described. Nevertheless, it will be understood that various modifications may be made without departing from the spirit and scope of the specification.

Specific structural and functional details disclosed herein are merely representative for purposes of describing example embodiments. Example embodiments, however, be embodied in many alternate forms and should not be construed as limited to only the embodiments set forth herein.

It can be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It can be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It can be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It can be further understood that terms, e.g., those defined in commonly used dictionaries, should be interpreted as having a meaning that is consistent with their meaning in the context of the relevant art and can not be interpreted in an idealized or overly formal sense unless expressly so defined herein.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of non-transitory program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should also be noted that while particular combinations of features described herein, the scope of the present disclosure is not limited to the particular combinations, but instead extends to encompass any combination of features or embodiments herein disclosed irrespective of whether or not that particular combination has been specifically enumerated.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

APPENDIX A: PROOF OF LEMMA 1

It is proven that the lemma holds for Class 2 refinement. The proofs for the other classes follow the same structure.

The blending functions before refinement are $$B_i(t) = B_{[t_i^0, t_i^1, t_i^2, t_i^3, t_i^4]}(t),$$

$i=1, \ldots, m$ and the central knots before refinement are thus $\{t_{\tau_1}^2, t_{\tau_2}^2, \ldots, t_{\tau_m}^2\}$, not necessarily in numerical order. Arrange the $B_i(t)$ such that the two upon which we perform Class 2 refinement are $B_{m-1}(t)$ and $B_m$, and insert the new knot $t_a$ into $B_{m-1}(t)$ and $B_m$. Since $B_{m-1}(t)$ and $B_m$ are refinement compatible, $$B_m(t) = B_{[t_{m-1}^1, t_{m-1}^2, t_{m-1}^3, t_{m-1}^4, t_m^4]}(t).$$

Denote the blending functions after refinement as $\hat{B}_i(t)$, where $\hat{B}_i(t)=B_i(t)$, $i=1, \ldots, m-2$, $$\hat{B}_{m-1}(t) = B_{[t_{m-1}^0, t_{m-1}^1, t_{m-1}^2, t_{m-1}^3 | t_a]}(t), \quad (A1)$$

$$\hat{B}_m(t) = B_{[t_{m-1}^1, t_{m-1}^2, t_{m-1}^3, t_{m-1}^4 | t_a]}(t), \text{ and}$$

$$\hat{B}_{m+1}(t) = B_{[t_{m-1}^2, t_{m-1}^3, t_{m-1}^4, t_m^4 | t_a]}(t).$$

$$B_{m-1}(t) = c_1^{m-1} \hat{B}_{m-1}(t) + c_2^{m-1} \hat{B}_m(t),$$

$$B_m(t) =$$
$$c_1^m \hat{B}_m(t) + c_2^m \hat{B}_{m+1}(t) B_{m-1}(t) = c_1^{m-1} \hat{B}_{m-1}(t) + c_2^{m-1} \hat{B}_m(t),$$

$$B_m(t) = c_1^m \hat{B}_m(t) + c_2^m \hat{B}_{m+1}(t)$$

where the $c_i^j$ are given in Eq. (5). From Eq. (A1),
$\hat{B}_{m-1}(t) = D_1 B_{m-1}(t) + D_2 B_m(t) + D_3 \hat{B}_{m+1}(t)$, $\hat{B}_m(t) = D_4 B_m(t) + D_5 \hat{B}_{m+1}(t)$ where $$D_1 = \frac{1}{c_1^{m-1}} \neq 0, D_4 = \frac{1}{c_1^m} \neq 0,$$

and the other $D_i$ are similar functions of the $c_i^j$.

We prove that the $\hat{B}_i(t)$ are linearly independent by showing that $\Sigma \hat{B}_i(t) d_i = 0$ only if all $d_i = 0$.

$$0 = \sum_{i=1}^{m+1} d_i \hat{B}_i(t) = \sum_{i=1}^{m-2} d_i B_i(t) + d_{m-1} \hat{B}_{m-1}(t) + d_m \hat{B}_m(t) + d_{m+1} \hat{B}_{m+1}(t) =$$

$$\sum_{i=1}^{m-2} d_i B_i(t) + d_{m-1} D_1 B_{m-1}(t) + (d_{m-1} D_2 + d_m D_4) B_m(t) +$$

$$(d_{m-1} D_3 + d_m D_5 + d_{m+1}) \hat{B}_{m+1}(t).$$

Since the multiplicity of knot $t_a$ in blending function $\hat{B}_{m+1}(t)$ is $r_2 + 1$ and its multiplicity is $<r_2+1$ in all other $\hat{B}_i(t)$, the coefficient of $\hat{B}_{m+1}(t)$ is zero, else the sum could not be zero because it would not be $C^3$ at $t_a$. The remaining m terms in the sum form a linear combination of the original m blending functions $B_i(t)$, but they are assumed to be linearly independent, so all of the remaining coefficients of the sum are zero. Hence, $$d_{m-1} D_1 = 0, d_{m-1} D_2 + d_m D_4 = 0, d_{m-1} D_3 + d_m D_5 + d_{m+1} = 0.$$

But, $D_1 \neq 0$, so $d_{m-1} = 0$. Likewise, $D_4 \neq 0$, so $d_m = 0$, and this forces $d_{m+1} = 0$. Thus, the only solution to the sum is for all $d_i = 0$, so the $\hat{B}_i(t)$ are linearly independent. QED.

APPENDIX B: PROOF OF LEMMA 2

Refer to FIG. 13B and consider the step of inserting points $P_4$, $P_5$, and $P_6$ along knot line $t_4$. By the definition of Row Insertion, $t_4$ does not appear in any previous blending functions, and the $B_{s_i}(s)$ functions for $P_4$, $P_5$, and $P_6$ are simple scales of the $B_{s_i}(s)$ functions for $P_1$, $P_2$, and $P_3$. Therefore, the blending functions for $P_4$, $P_5$, and $P_6$ are linearly independent. The new $B_{s_i}(s)$ functions for $P_1$, $P_2$, and $P_3$ are simple scales of their initial values, so the blending functions along $t_3$ remain linearly independent. Since the insertion operation does not change the $B_{s_i}(s)$ values for any other row, the blending functions along all other horizontal knot lines are also linearly independent.

The only columns whose $B_{t_i}(t)$ blending functions change are those with knot indices 2, 4, and 6. But the refinements of those blending functions amount to refinement of S-spline curves, so by Lemma 1, the blending functions along those columns are linear independent. All other columns remain unchanged, and thus remain linear independent. QED.

APPENDIX C: PROOF OF THEOREM 1

Let $t_\lambda$ be the t knot value along which the new row of control points is inserted. Denote the initial n blending functions $B_i(s,t) = \beta_i B_{s_i}(s) B_{t_i}(t)$. After Row Insertion, these blending functions are changed to $\hat{B}_i(s,t)$. The blending functions for the m new control points are $\tilde{B}_i(s,t) = \tilde{\beta}_i \tilde{B}_{s_i}(s) \tilde{B}_{t_i}(t)$. Denote $S_1 = \{\hat{B}_1(s,t), \ldots, \hat{B}_n(s,t), \tilde{B}_1(s,t), \ldots, \tilde{B}_m(s,t)\}$ and $S_2 = \{\hat{B}_1(s,t), \ldots, \hat{B}_n(s,t), \tilde{B}_1(s,t), \ldots, \tilde{B}_m(S, t)\}$ and let $S_1$ and $S_2$ be the linear space spanned by the sets $S_1$ and $S_2$, respectively.

It is proven that the blending functions in $S_1$ are linearly independent by seeking $c_i$ and $d_j$ such that $$\sum_{i=1}^{n} c_i B_i(s, t) + \sum_{j=1}^{m} d_j \tilde{B}_j(s, t) \equiv 0. \quad (C1)$$

Using $r_2$ as defined in the Row Insertion definition, take the partial derivative, $$\frac{\partial^{3-r_2} \sum_{j=1}^{m} d_j \tilde{B}_j(s, t)}{\partial t}\bigg|_{t_\lambda^-}^{t_\lambda^+} = -\frac{\partial^{3-r_2} \sum_{i=1}^{n} c_i B_i(s, t)}{\partial t}\bigg|_{t_\lambda^-}^{t_\lambda^+}. \quad (C2)$$

where $$\bigg|_{t_\lambda^-}^{t_\lambda^+}$$

denotes the difference in the limits of the partial derivatives at $t_\lambda$ as approached from the left and from the right. Since all $B_i(s,t)$ have continuous derivatives of order $3-r_d$ at $t=t_\lambda$, the right side of Eq. (C2) equals zero so $$\frac{\partial^3 \sum_{j=1}^{m} d_j \tilde{B}_j(s, t)}{\partial t}\bigg|_{t_\lambda^-}^{t_\lambda^+} = \quad (C3)$$

$$\sum_{j=1}^{m} d_j \tilde{\beta}_j \tilde{B}_{s_j}(s) \left(\frac{\partial^3 \tilde{B}_{t_j}(t)}{\partial t}\bigg|_{t_\lambda^-}^{t_\lambda^+}\right) = \sum_{j=1}^{m} d_j \tilde{\beta}_j \tilde{e}_j \tilde{B}_{s_j}(s) = 0,$$

where $$\tilde{e}_j = \left(\frac{\partial^3 \tilde{B}_{t_j}(t)}{\partial t}\bigg|_{t_\lambda^-}^{t_\lambda^+}\right).$$

Since $\tilde{B}_{t_j}(t)$ always has a discontinuous derivative of order $3-r_d$ at $t=t_\lambda$ for any $t_j$, all $\tilde{e}_j \neq 0$. Since $\tilde{\beta}_j$ is only assigned by the refinement algorithm, all $\tilde{\beta}_j \neq 0$. By Lemma 2, $P(s,t)$ is row linearly independent, and since the $\tilde{B}_{s_j}(s)$, $i=1, \ldots, m$ are the blending functions on the row $t=t_\lambda$, they are linearly independent. Therefore, the only way Eq. (C3) can be satisfied is for $(d_j\tilde{\beta}_1\tilde{e}_j)=0$, $j=1, \ldots, m$. But since $\tilde{\beta}_j$ and $\tilde{e}_j$ are never zero, we can have $d_j=0$, $j=1, \ldots, m$ and Eq. (C1) leaves us $\Sigma_{i=1}^n c_i B_i(s,t)=0$.

According to the hypothesis, the $B_i(s,t)$ are linearly independent, so we can have $c_i=0$, $i=1, \ldots, n$. Therefore, the blending functions in $S_1$ are linearly independent and dim $(S_1)=n+m$. Since any blending function in $S_1$ can be represented as a linear combination of the blending functions in $S_2$, $S_1 \subseteq S_2$, which implies dim$(S_2) \geq n+m$. However, since $S_2$ is a linear space spanned by $n+m$ blending functions, dim $(S_2) \leq n+m$. Thus, dim$(S_2)=n+m$ and the blending functions in $S_2$ are also linearly independent. QED.

What is claimed is:

1. A method, comprising:
   receiving, by processing circuitry configured to generate a surface model representing an object, spatial mesh data representing a first spatial mesh, the first spatial mesh including a first plurality of control points, each of the first plurality of control points having a respective spatial position and corresponding to a respective B-spline blending function of a first plurality of B-spline blending functions, each of the plurality of first B-spline blending functions being defined by a respective local knot array and representing the surface model; and
   performing, by the processing circuitry, a control point insertion operation on the spatial mesh data to add an additional control point to the first spatial mesh and produce a second spatial mesh, the second spatial mesh including a second plurality of control points, the second plurality of control points including the first plurality of control points and the additional control point, each of the second plurality of control points having a respective spatial position and corresponding to a respective B-spline blending function of a second plurality of B-spline blending functions, the respective B-spline blending functions of the second plurality of B-spline blending functions to which a specified number of control points of the second plurality of control points adjacent to the additional control point correspond being defined by a respective local knot array different from the respective local knot array of a B-spline blending function of the first plurality of B-spline blending functions having the same spatial position, the respective B-spline blending functions of the second plurality of B-spline blending functions to which the other control points of the second plurality of control points correspond being defined by a respective local knot array that is the same as the respective local knot array of a B-spline blending function of the first plurality of B-spline blending functions having the same spatial position,
   the first spatial mesh and the second spatial mesh producing the same surface model representing the object.

2. The method as in claim 1, wherein the second plurality of B-spline blending functions form a linearly independent set of functions.

3. The method as in claim 1, wherein each of the first plurality of B-spline blending functions and second plurality of B-spline blending functions includes a product of a first B-spline basis function and a second B-spline basis function, the local knot array defining each of the first plurality of B-spline blending functions and second plurality of B-spline blending functions including, respectively, a first local knot vector representing a plurality of knots along a first line and a second local knot vector representing a plurality of knots along a second line orthogonal to the first line.

4. The method as in claim 3, wherein each of the first local knot vector and the second local knot vector has an odd number of elements, the center elements of the first local knot vector and the second local knot vector being based on the position of the control point corresponding to the B-spline blending function defined by the local knot array including the first local knot vector and the second local knot vector.

5. The method as in claim 3, wherein each of the first local knot vector and the second local knot vector has an odd number of elements, the off-center elements of the first local knot vector and the second local knot vector being based on the position of neighboring control points on either side of the control point corresponding to the B-spline blending function defined by the local knot array including the first local knot vector and the second local knot vector, along the first line and the second line.

6. The method as in claim 3, wherein the specified number of control points of the second plurality of control points adjacent to the additional control point is one,
   wherein the additional control point is located along a line in a coordinate direction between two adjacent control points of the first plurality of control points, and
   wherein performing the control point insertion operation on the spatial mesh data includes replacing the B-spline blending function to which an adjacent control point corresponds with a new B-spline blending function, the new B-spline blending function including a product of the first B-spline basis function and a third B-spline basis function, the third B-spline function being defined by a third local knot vector, the third local knot vector differing from the first local knot vector in either side of an insertion point in the local knot vector corresponding to the position of the control point.

7. The method as in claim 3, wherein the specified number of control points of the second plurality of control points adjacent to the additional control point is two,
   wherein the additional control point is located along a line in a coordinate direction between a first adjacent control point and a second adjacent control point of the first plurality of control points, and
   wherein performing the control point insertion operation on the spatial mesh data includes replacing the B-spline blending functions to which the first and second adjacent control points correspond with new B-spline blending functions, the new B-spline blending function to which the first adjacent control point corresponds including a product of the first B-spline basis function and a third B-spline basis function, the new B-spline blending function to which the second adjacent control point corresponds including a product of the first B-spline basis function and a fourth B-spline basis function the third B-spline function being defined by a third local knot vector, the fourth B-spline basis function being defined by a fourth local knot vector, each of the third local knot vector and the fourth local knot vector differing from the second local knot vector in either side of an element corresponding to an inserted knot.

8. The method as in claim 7, wherein a second additional control point is located along a line in a direction orthogonal to the coordinate direction,
   wherein the specified number of control points of the second plurality of control points adjacent to the second additional control point is one, and
   wherein performing the control point insertion operation on the spatial mesh data includes replacing the B-spline blending function to which an adjacent control point corresponds with a new B-spline blending function, the new B-spline blending function including a product of a fifth B-spline basis function and the second B-spline basis function, the fifth B-spline function being defined by a fifth local knot vector, the fifth local knot vector differing from the first local knot vector in either side of an element corresponding to an inserted knot.

9. A computer program product comprising a nontransitory storage medium, the computer program product including code that, when executed by processing circuitry of a computer configured to generate a surface model representing an object, causes the processing circuitry to perform a method, the method comprising:

receiving spatial mesh data representing a first spatial mesh, the first spatial mesh including a first plurality of control points, each of the first plurality of control points having a respective spatial position and corresponding to a respective B-spline blending function of a first plurality of B-spline blending functions, each of the plurality of first B-spline blending functions being defined by a respective local knot array and representing the surface model; and performing a control point insertion operation on the spatial mesh data to add an additional control point to the first spatial mesh and produce a second spatial mesh, the second spatial mesh including a second plurality of control points, the second plurality of control points including the first plurality of control points and the additional control point, each of the second plurality of control points having a respective spatial position and corresponding to a respective B-spline blending function of a second plurality of B-spline blending functions, the respective B-spline blending functions of the second plurality of B-spline blending functions to which a specified number of control points of the second plurality of control points adjacent to the additional control point correspond being defined by a respective local knot array different from the respective local knot array of a B-spline blending function of the first plurality of B-spline blending functions having the same spatial position, the respective B-spline blending functions of the second plurality of B-spline blending functions to which the other control points of the second plurality of control points correspond being defined by a respective local knot array that is the same as the respective local knot array of a B-spline blending function of the first plurality of B-spline blending functions having the same spatial position, the first spatial mesh and the second spatial mesh producing the same surface model representing the object.

10. The computer program product as in claim 9, wherein the second plurality of B-spline blending functions form a linearly independent set of functions.

11. The computer program product as in claim 9, wherein each of the first plurality of B-spline blending functions and second plurality of B-spline blending functions includes a product of a first B-spline basis function and a second B-spline basis function, the local knot array defining each of the first plurality of B-spline blending functions and second plurality of B-spline blending functions including, respectively, a first local knot vector representing a plurality of knots along a first line and a second local knot vector representing a plurality of knots along a second line orthogonal to the first line.

12. The computer program product as in claim 11, wherein each of the first local knot vector and the second local knot vector has an odd number of elements, the center elements of the first local knot vector and the second local knot vector being based on the position of the control point corresponding to the B-spline blending function defined by the local knot array including the first local knot vector and the second local knot vector.

13. The computer program product as in claim 11, wherein each of the first local knot vector and the second local knot vector has an odd number of elements, the off-center elements of the first local knot vector and the second local knot vector being based on the position of neighboring control points on either side of the control point corresponding to the B-spline blending function defined by the local knot array including the first local knot vector and the second local knot vector, along the first line and the second line.

14. The computer program product as in claim 11, wherein the specified number of control points of the second plurality of control points adjacent to the additional control point is one, wherein the additional control point is located along a line in a coordinate direction between two adjacent control points of the first plurality of control points, and wherein performing the control point insertion operation on the spatial mesh data includes replacing the B-spline blending function to which an adjacent control point corresponds with a new B-spline blending function, the new B-spline blending function including a product of the first B-spline basis function and a third B-spline basis function, the third B-spline function being defined by a third local knot vector, the third local knot vector differing from the first local knot vector in either side of an insertion point in the local knot vector corresponding to the position of the control point.

15. The computer program product as in claim 11, wherein the specified number of control points of the second plurality of control points adjacent to the additional control point is two, wherein the additional control point is located along a line in a coordinate direction between a first adjacent control point and a second adjacent control point of the first plurality of control points, and wherein performing the control point insertion operation on the spatial mesh data includes replacing the B-spline blending functions to which the first and second adjacent control points correspond with new B-spline blending functions, the new B-spline blending function to which the first adjacent control point corresponds including a product of the first B-spline basis function and a third B-spline basis function, the new B-spline blending function to which the second adjacent control point corresponds including a product of the first B-spline basis function and a fourth B-spline basis function the third B-spline function being defined by a third local knot vector, the fourth B-spline basis function being defined by a fourth local knot vector, each of the third local knot vector and the fourth local knot vector differing from the second local knot vector in either side of an element corresponding to an inserted knot.

16. The computer program product as in claim 15, wherein a second additional control point is located along a line in a direction orthogonal to the coordinate direction, wherein the specified number of control points of the second plurality of control points correspond adjacent to the second additional control point is one, and wherein performing the control point insertion operation on the spatial mesh data includes replacing the B-spline blending function to which an adjacent control point corresponds with a new B-spline blending function, the new B-spline blending function including a product of a fifth B-spline basis function and the second B-spline basis function, the fifth B-spline function being defined by a fifth local knot vector, the fifth local knot vector differing from the first local knot vector in either side of an element corresponding to an inserted knot.

17. An electronic apparatus configured to, the electronic apparatus comprising:

a memory; and controlling circuitry coupled to the memory, the controlling circuitry being configured to:

receiving spatial mesh data representing a first spatial mesh, the first spatial mesh including a first plurality of control points, each of the first plurality of control points having a respective spatial position and corresponding to a respective B-spline blending function of a first plurality of B-spline blending functions, each of the plurality of first B-spline blending functions being defined by a respective local knot array and representing the surface model; and performing a control point insertion operation on the spatial mesh data to add an additional control point to the first spatial mesh and produce a second spatial mesh, the second spatial mesh including a second plurality of control points, the second plurality of control points including the first plurality of control points and the additional control point, each of the second plurality of control points having a respective spatial position and corresponding to a respective B-spline blending function of a second plurality of B-spline blending functions, the respective B-spline blending functions of the second plurality of B-spline blending functions to which a specified number of control points of the second plurality of control points adjacent to the additional control point correspond being defined by a respective local knot array different from the respective local knot array of a B-spline blending function of the first plurality of B-spline blending functions having the same spatial position, the respective B-spline blending functions of the second plurality of B-spline blending functions to which the other control points of the second plurality of control points correspond being defined by a respective local knot array that is the same as the respective local knot array of a B-spline blending function of the first plurality of B-spline blending functions having the same spatial position, the first spatial mesh and the second spatial mesh producing the same surface model representing the object.

18. The electronic apparatus as in claim 17, wherein the second plurality of B-spline blending functions form a linearly independent set of functions.

19. The electronic apparatus as in claim 17, wherein each of the first plurality of B-spline blending functions and second plurality of B-spline blending functions includes a product of a first B-spline basis function and a second B-spline basis function, the local knot array defining each of the first plurality of B-spline blending functions and second plurality of B-spline blending functions including, respectively, a first local knot vector representing a plurality of knots along a first line and a second local knot vector representing a plurality of knots along a second line orthogonal to the first line.

20. The electronic apparatus as in claim 19, wherein each of the first local knot vector and the second local knot vector has an odd number of elements, the center elements of the first local knot vector and the second local knot vector being based on the position of the control point corresponding to the B-spline blending function defined by the local knot array including the first local knot vector and the second local knot vector.

* * * * *